US010790299B2

(12) United States Patent
Shim

(10) Patent No.: US 10,790,299 B2
(45) Date of Patent: Sep. 29, 2020

(54) SEMICONDUCTOR DEVICE AND METHOD OF FABRICATING THE SAME

(71) Applicant: Samsung Electronics Co., Ltd., Suwon-si, Gyeonggi-do (KR)

(72) Inventor: Sunil Shim, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/282,701

(22) Filed: Feb. 22, 2019

(65) Prior Publication Data

US 2020/0013797 A1 Jan. 9, 2020

(30) Foreign Application Priority Data

Jul. 9, 2018 (KR) ........................ 10-2018-0079530

(51) Int. Cl.
*H01L 27/11582* (2017.01)
*H01L 27/11565* (2017.01)
*H01L 21/768* (2006.01)
*H01L 21/56* (2006.01)
*H01L 27/11573* (2017.01)

(52) U.S. Cl.
CPC ...... *H01L 27/11582* (2013.01); *H01L 21/565* (2013.01); *H01L 21/76837* (2013.01); *H01L 27/11565* (2013.01); *H01L 27/11573* (2013.01)

(58) Field of Classification Search
CPC ......... H01L 27/11582; H01L 27/11565; H01L 21/76837; H01L 21/565; H01L 27/11573
USPC ........................................................ 257/324
See application file for complete search history.

(56) References Cited

U.S. PATENT DOCUMENTS 8,295,089 B2 10/2012 Jeong et al.
8,877,626 B2 11/2014 Lee et al.
9,299,717 B2 3/2016 Lee et al.
9,564,451 B1 2/2017 Shin et al.
9,711,528 B2 7/2017 Matsuda et al.
9,786,676 B2 10/2017 Yun et al.
9,870,991 B1 1/2018 Kim et al.
2011/0269304 A1* 11/2011 Kim .................. H01L 21/02057 438/591
2016/0343730 A1* 11/2016 Son ....................... H01L 23/528
2016/0343799 A1* 11/2016 Yi ........................... H01L 28/91
2017/0194345 A1 7/2017 Nojima
2017/0309637 A1 10/2017 Yun et al.

* cited by examiner

*Primary Examiner* — Fernando L Toledo
*Assistant Examiner* — Adam S Bowen
(74) *Attorney, Agent, or Firm* — Harness, Dickey & Pierce, P.L.C.

(57) ABSTRACT

Disclosed are semiconductor devices and methods of fabricating the same. The method comprises forming on a substrate a mold structure including a plurality of sacrificial patterns and a plurality of dielectric patterns that are alternately stacked, patterning the mold structure to form a plurality of preliminary stack structures extending in a first direction, forming on the preliminary stack structures a support pattern that extends in a direction intersecting the first direction and extends across the preliminary stack structures, and replacing the sacrificial patterns with conductive patterns to form a plurality of stack structures from the preliminary stack structures. The support pattern remains on the stack structures.

20 Claims, 33 Drawing Sheets

SPP VS SPP SPP VS SPP SPP SPP
A GP
PST GP
B' B
PST GP
A'
CAR CNR
D2 D1 D3

SEMICONDUCTOR DEVICE AND METHOD OF FABRICATING THE SAME

CROSS-REFERENCE TO RELATED APPLICATION

This U.S. nonprovisional application claims priority under 35 U.S.C § 119 to Korean Patent Application No. 10-2018-0079530 filed on Jul. 9, 2018 in the Korean Intellectual Property Office, the entire contents of which are hereby incorporated by reference.

BACKGROUND

The present inventive concepts relate to a semiconductor device and a method of fabricating the same, and more particularly, to a semiconductor device having three-dimensionally arranged memory cells and a method of fabricating the same.

Semiconductor devices have been highly integrated to meet higher performance and/or lower manufacturing cost which are required by customers. Because integration of the semiconductor devices is an important factor in determining product price, higher integration is increasingly requested. Integration of typical two-dimensional or planar semiconductor memory devices is primarily determined by the area occupied by a unit memory cell, such that it is greatly influenced by the level of technology for forming fine patterns. However, the extremely expensive processing equipment needed to increase pattern fineness may set a practical limitation on increasing the integration of the two-dimensional or planar semiconductor memory devices. Therefore, there have been proposed three-dimensional semiconductor memory devices having three-dimensionally arranged memory cells.

SUMMARY

Some example embodiments of the present inventive concepts provide a semiconductor device having enhanced reliability and a method of fabricating the same.

Aspects of the present inventive concepts is not limited to the mentioned above, and other objects which have not been mentioned above will be clearly understood to those skilled in the art from the following description.

According to some example embodiments of the present inventive concepts, a method of fabricating a semiconductor device may comprise: forming on a substrate a mold structure including a plurality of sacrificial patterns and a plurality of dielectric patterns that are alternately stacked; patterning the mold structure to form a plurality of preliminary stack structures extending in a first direction; forming on the preliminary stack structures a support pattern that extends in a direction intersecting the first direction and extends across the preliminary stack structures; and replacing the sacrificial patterns with conductive patterns to form a plurality of stack structures from the preliminary stack structures. The support pattern may remain on the stack structures.

According to some example embodiments of the present inventive concepts, a method of fabricating a semiconductor device may comprise: forming on a substrate first and second preliminary stack structures that extend in parallel along a first direction, each of the first and second preliminary stack structures including a plurality of sacrificial patterns and a plurality of dielectric patterns that are alternately stacked; forming a gap-fill pattern between facing side surfaces of the first and second preliminary stack structures; forming a support pattern on the first and second preliminary stack structures, the support pattern covering a portion of a top surface of the gap-fill pattern; and removing the gap-fill pattern to expose the facing side surfaces of the first and second preliminary stack structures.

According to some example embodiments of the present inventive concepts, a semiconductor device may comprise: a plurality of stack structures that extend in parallel along a first direction on a substrate, each of the stack structures including a plurality of electrodes and a plurality of dielectric patterns that are alternately stacked on the substrate; a plurality of vertical structures that penetrate the stack structures; a separation structure between the stack structures; and a support pattern that lies on the stack structures and extends in a direction across the stack structures, the direction intersecting the first direction. The support pattern may cover a portion of a top surface of the separation structure.

BRIEF DESCRIPTION OF THE DRAWINGS

FIGS. 2A to 10A illustrate plan views showing a method of fabricating a semiconductor device according to some example embodiments of the present inventive concepts.

FIGS. 2B to 10B illustrate cross-sectional views taken along line A-A' of FIGS. 2A to 10A, respectively, showing a method of fabricating a semiconductor device according to some example embodiments of the present inventive concepts.

FIGS. 2C to 10C illustrate cross-sectional views taken along line B-B' of FIGS. 2A to 10A, respectively, showing a method of fabricating a semiconductor device according to some example embodiments of the present inventive concepts.

DETAILED DESCRIPTION OF EXAMPLE EMBODIMENTS

Figure 1:
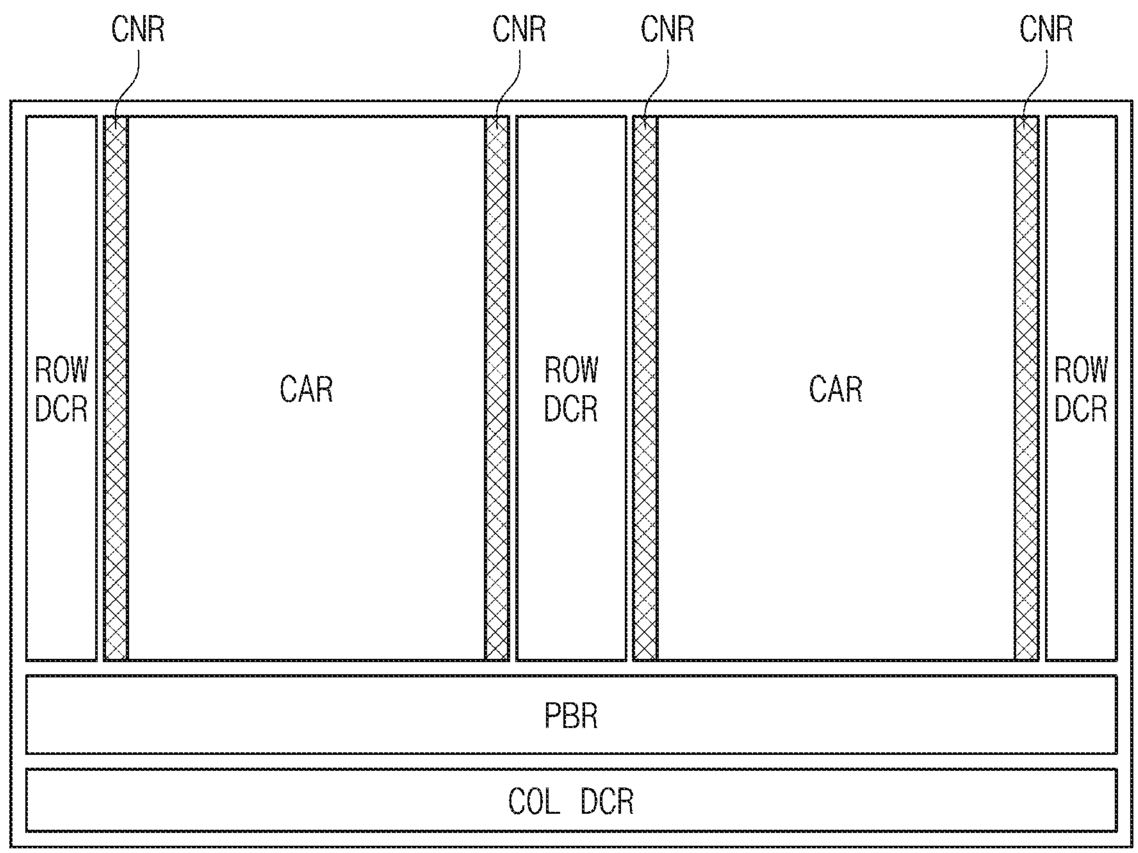
FIG. 1 illustrates a schematic diagram showing a simplified configuration of a semiconductor device according to some example embodiments of the present inventive concepts.

FIG. 1 illustrates a schematic diagram showing a simplified configuration of a semiconductor device according to some example embodiments of the present inventive concepts.

Referring to FIG. 1, a semiconductor device may include cell array regions CAR and a peripheral circuit region. The semiconductor device may be a three-dimensional semiconductor memory device. The peripheral circuit region may include row decoder regions ROW DCR, a page buffer region PBR, a column decoder region COL DCR, and/or a control circuit region (not shown). In some example embodiments, a connection region CNR may be disposed between each of the cell array regions CAR and each of the row decoder regions ROW DCR.

The cell array region CAR may include a memory cell array that includes a plurality of memory cells. The memory cell array may include three-dimensionally arranged memory cells, a plurality of word lines electrically connected to the memory cells, and a plurality of bit lines electrically connected to the memory cells.

The row decoder region ROW DCR may include a row decoder that selects the word lines of the memory cell array, and the connection region CNR may include a connection structure that electrically connects the memory cell array to the row decoder. In accordance with address information, the row decoder may select one of the word lines of the memory cell array, and may provide word line voltages to the selected word line and unselected word lines in response to a control signal from a control unit.

The page buffer region PBR may include a page buffer that reads data stored in the memory cells. Depending on an operating mode, the page buffer may temporarily store data to be stored in the memory cells or sense data stored in the memory cells. The page buffer may act as a write driver circuit in a program operating mode and as a sense amplifier circuit in a read operating mode.

The column decoder region COL DCR may include a column decoder connected to the bit lines of the memory cell array. The column decoder may provide a data transmission path between the page buffer and an external device (e.g., a memory controller).

FIGS. 2A to 10A illustrate plan views showing a method of fabricating a semiconductor device according to some example embodiments of the present inventive concepts. FIGS. 2B to 10B illustrate cross-sectional views taken along line A-A' of FIGS. 2A to 10A, respectively, showing a method of fabricating a semiconductor device according to some example embodiments of the present inventive concepts. FIGS. 2C to 10C illustrate cross-sectional views taken along line B-B' of FIGS. 2A to 10A, respectively, showing a method of fabricating a semiconductor device according to some example embodiments of the present inventive concepts.

Figure 2A:
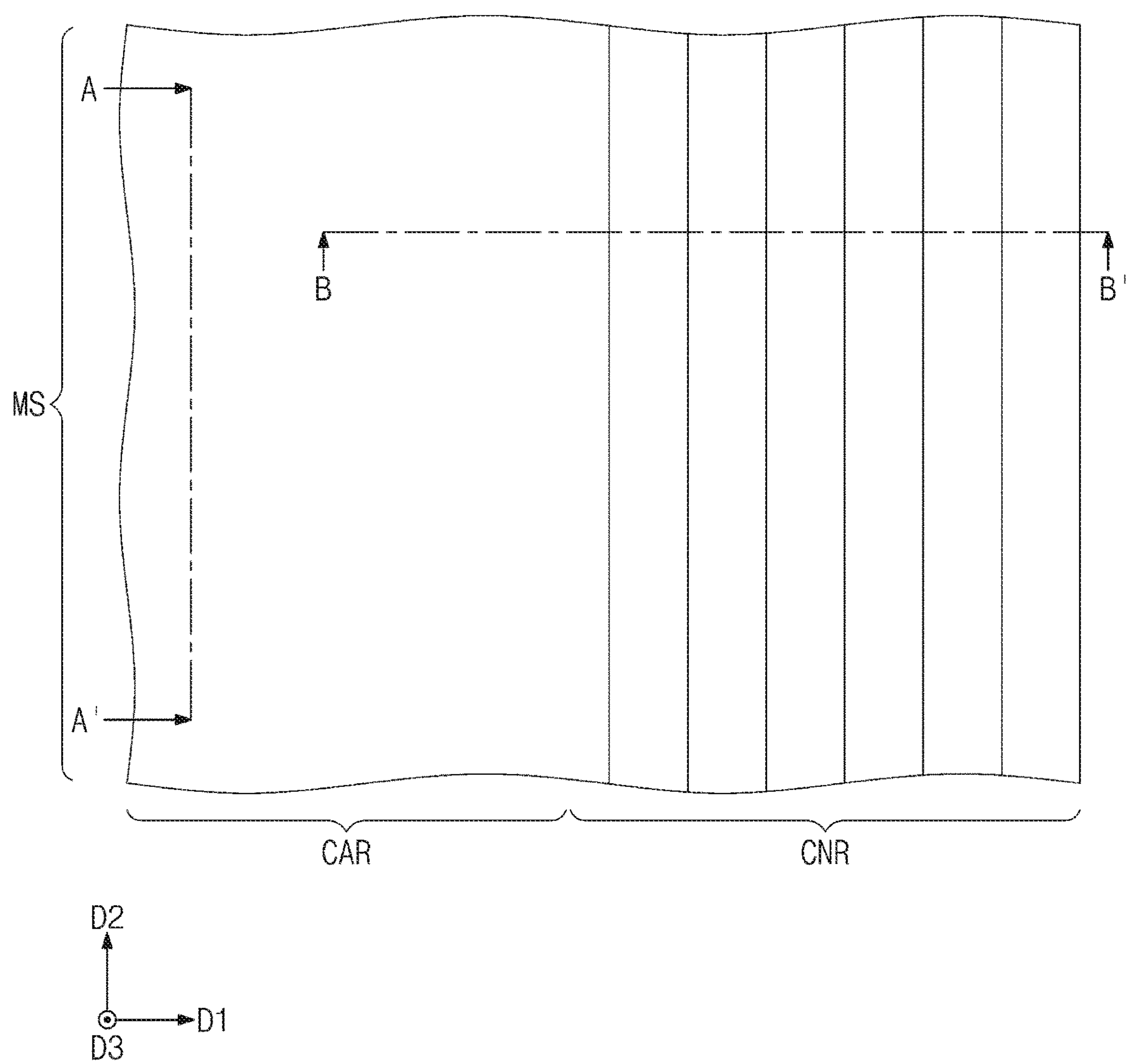
Figure 2B:
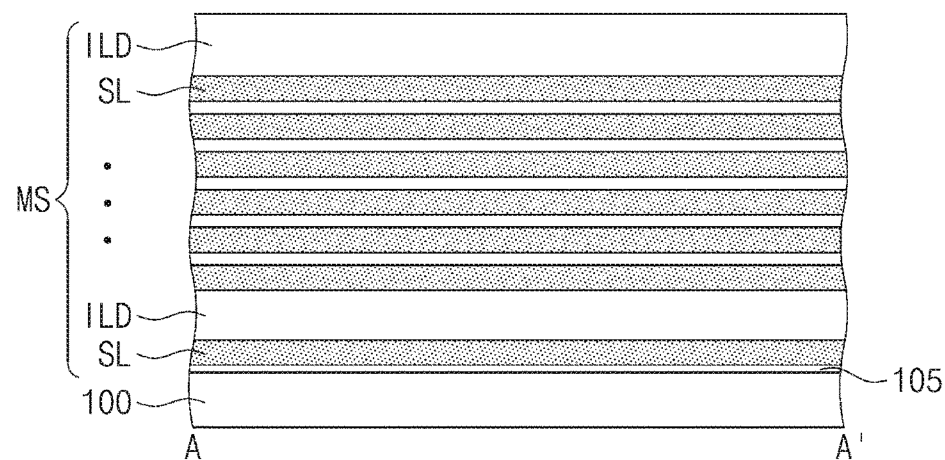
Figure 2C:
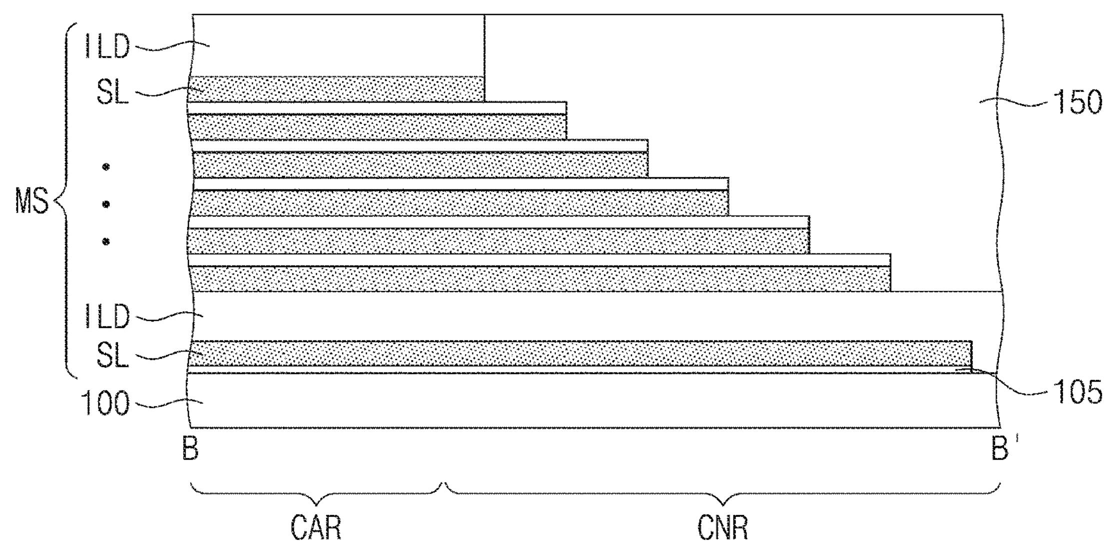

Referring to FIGS. 2A to 2C, a mold structure MS may be formed on a substrate 100. The substrate 100 may include a cell array region CAR and a connection region CNR that is adjacent in a first direction D1 to the cell array region CAR.

The substrate 100 may include one of a semiconductor material (e.g., silicon wafer), a dielectric material (e.g., glass), a semiconductor covered with a dielectric material, or a conductor. For example, the substrate 100 may be a silicon wafer having a first conductivity (e.g., p-type).

The mold structure MS may include sacrificial patterns SL and dielectric patterns ILD that are stacked on the substrate 100. Each of the sacrificial and dielectric patterns SL and ILD may have a plate shape that extends in the first direction D1 and in a second direction D2 perpendicular to the first direction D1. The sacrificial patterns SL and the dielectric patterns ILD may be alternately stacked along a third direction D3 perpendicular to a top surface of the substrate 100. For the mold structure MS, an uppermost dielectric pattern ILD may be thicker than other dielectric patterns ILD. The sacrificial patterns SL may include a dielectric material different from that of the dielectric patterns ILD. For example, the sacrificial patterns SL may be silicon nitride layers, and the dielectric patterns ILD may be silicon oxide layers.

The formation of the mold structure MS may include forming a thin-layer structure including alternately stacked the sacrificial patterns SL and the dielectric patterns ILD on an entire surface of the substrate 100 and then performing a trimming process on the thin-layer structure. Before the formation of the thin-layer structure, a buffer dielectric layer 105 may be formed on the substrate 100. The buffer dielectric layer 105 may be, for example, a silicon oxide layer formed by thermal oxidation. The buffer dielectric layer 105 may have a thickness less than those of the sacrificial patterns SL and of the dielectric patterns ILD, which patterns SL and ILD are formed on the buffer dielectric layer 105. The trimming process may cause the mold structure MS to have a stepwise structure on the connection region CNR. On the connection region CNR, the mold structure MS may have a height that decreases with increasing distance from the cell array region CAR. After the mold structure MS is formed, a planarized dielectric layer 150 may be formed on the entire surface of the substrate 100. The planarized dielectric layer 150 may have a substantially flat top surface, and may be formed of a dielectric material having an etch selectivity with respect to the sacrificial patterns SL.

Figure 3A:
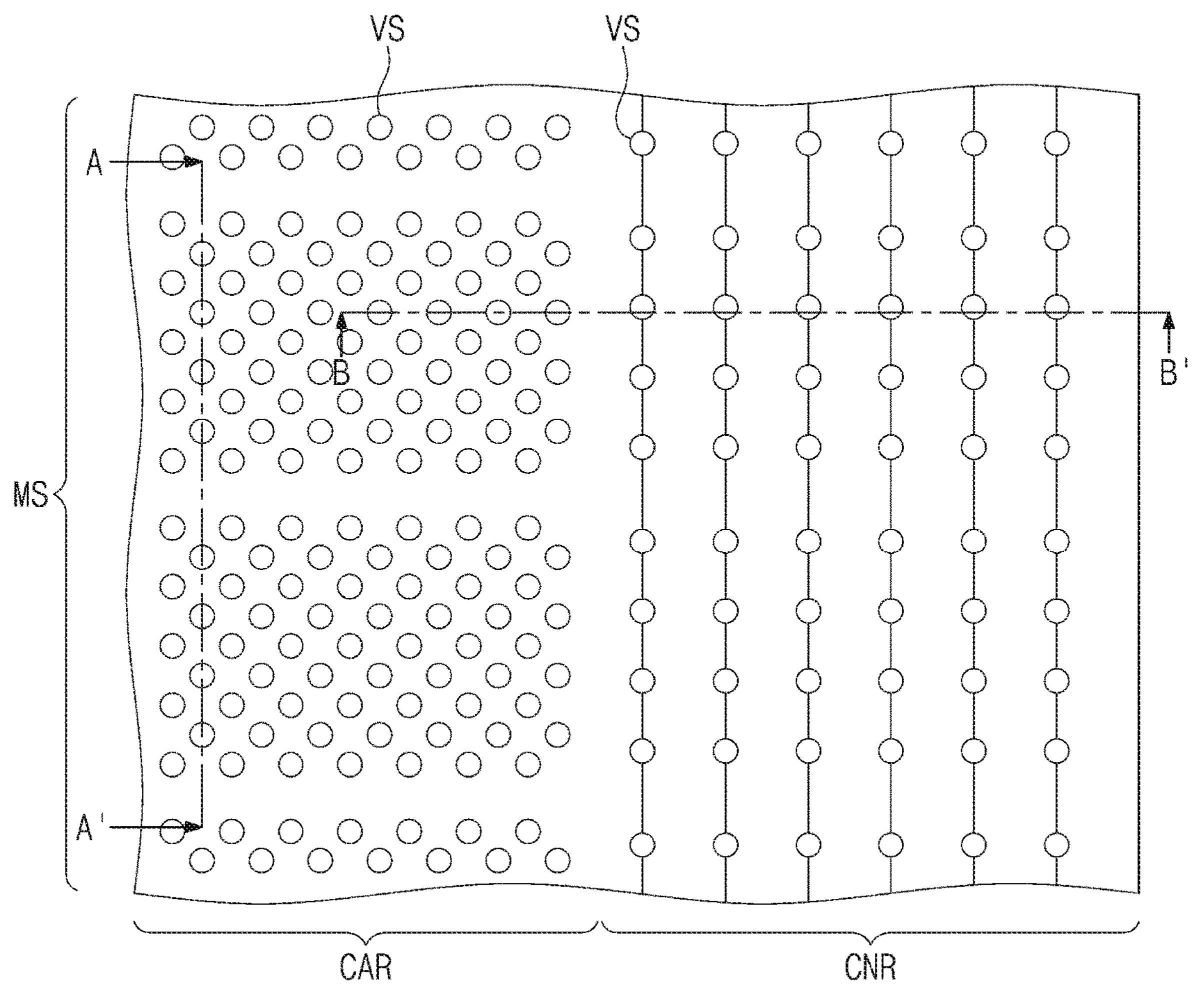
Figure 3B:
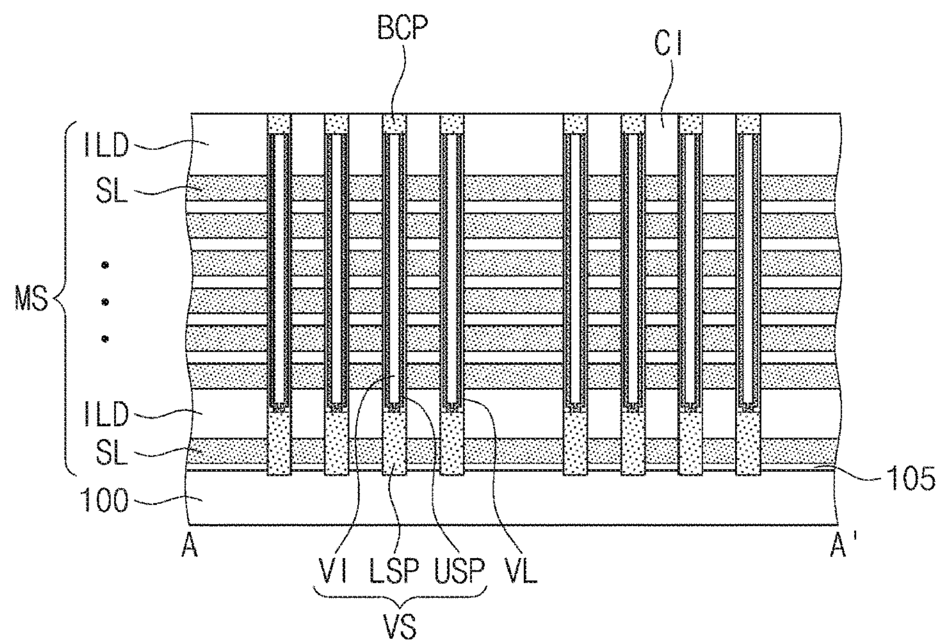
Figure 3C:
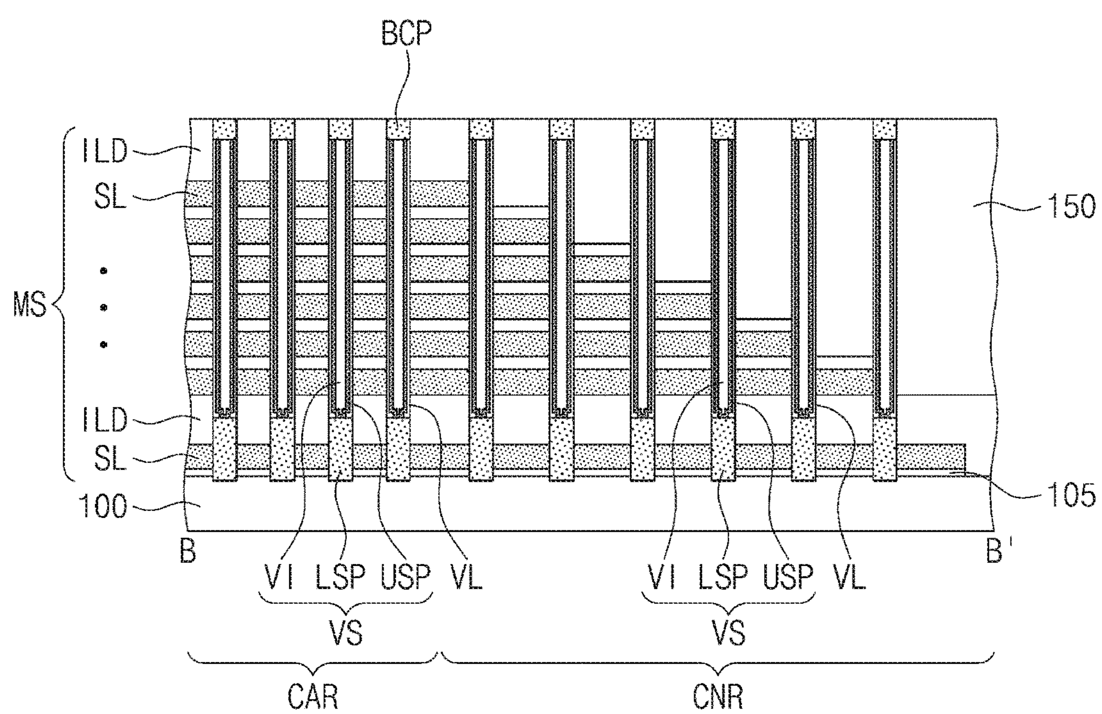

Referring to FIGS. 3A to 3C, vertical channel structures VS may be formed on each of the cell array region CAR and the connection region CNR.

The formation of the vertical channel structures VS may include forming vertical holes to penetrate the mold structure MS and the buffer dielectric layer 105 and to expose the substrate 100, and then forming in each of the vertical holes a lower semiconductor pattern LSP, an upper semiconductor pattern USP, and a data storage pattern VL. The vertical holes may be obtained by forming a mask pattern (not shown) on the mold structure MS and performing an anisotropic etching process in which the mask pattern is used as an etching mask.

The lower semiconductor pattern LSP may be an epitaxial pattern that is formed by a selective epitaxial growth (SEG) process in which the substrate 100 exposed to the vertical holes is used as a seed layer. The lower semiconductor pattern LSP may be formed to have a pillar shape that fills a lower portion of the vertical hole. Alternatively, the formation of the lower semiconductor pattern LSP may be omitted.

The upper semiconductor pattern USP may be formed in the vertical hole in which the lower semiconductor pattern LSP is formed. The upper semiconductor pattern USP may be formed by depositing a semiconductor layer having a uniform thickness in the vertical hole. The semiconductor layer may be conformally formed to have a thickness that does not completely fill the vertical hole. Accordingly, the upper semiconductor patterns USP may define empty spaces (or gaps) in the vertical holes, and the empty space may be filled with air or a buried dielectric pattern VI. A bit line conductive pad BCP may be formed at a top end of the upper semiconductor pattern USP. The bit line conductive pad BCP may be an impurity-doped region or includes a conductive material.

Each of the vertical channel structures VS may penetrate the mold structure MS and have connection with the substrate 100. When viewed in plan, the vertical channel structures VS may be arranged two-dimensionally. For example, the vertical channel structures VS may be arranged in a zigzag fashion.

Figure 4A:
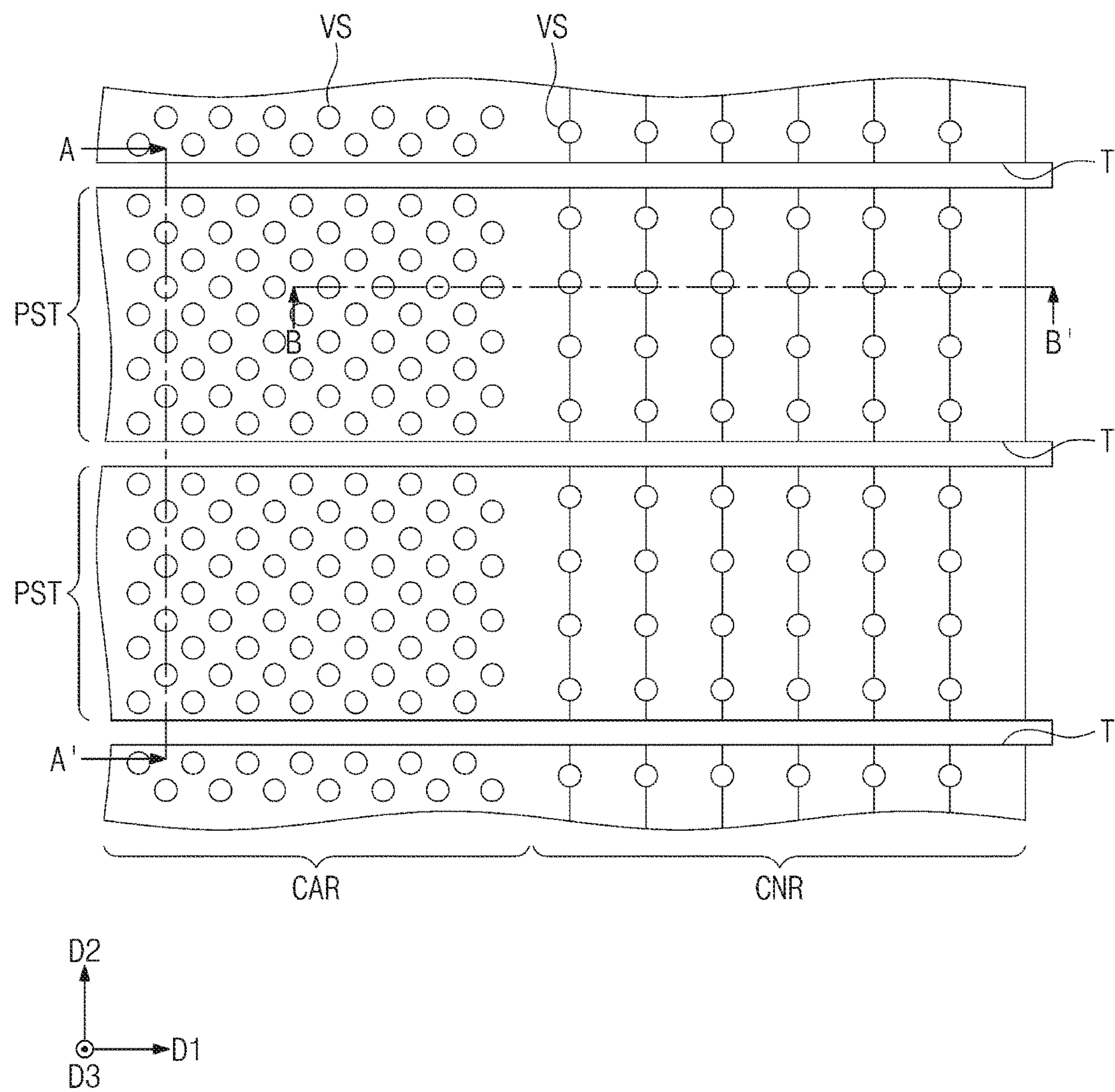
Figure 4B:
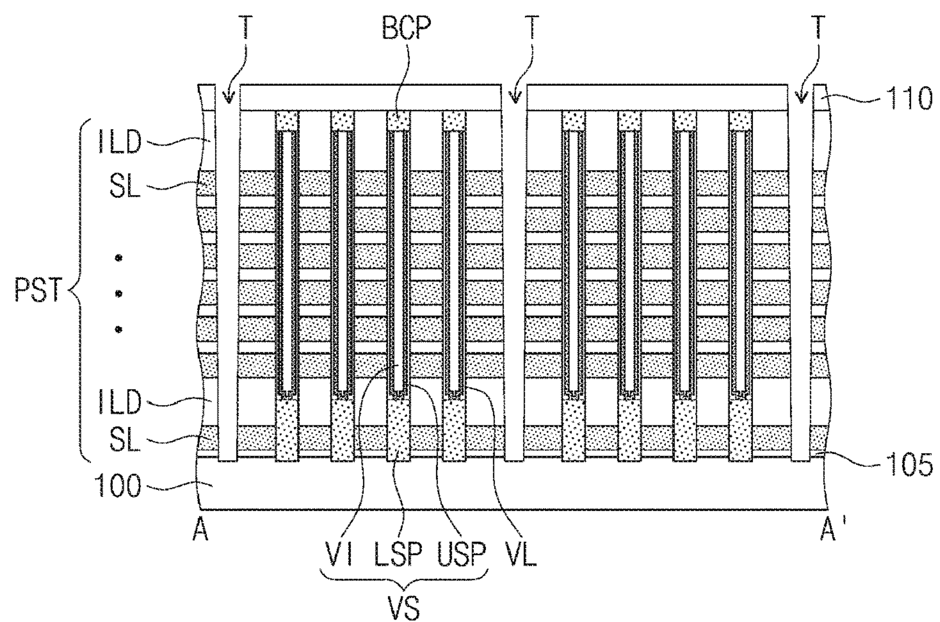
Figure 4C:
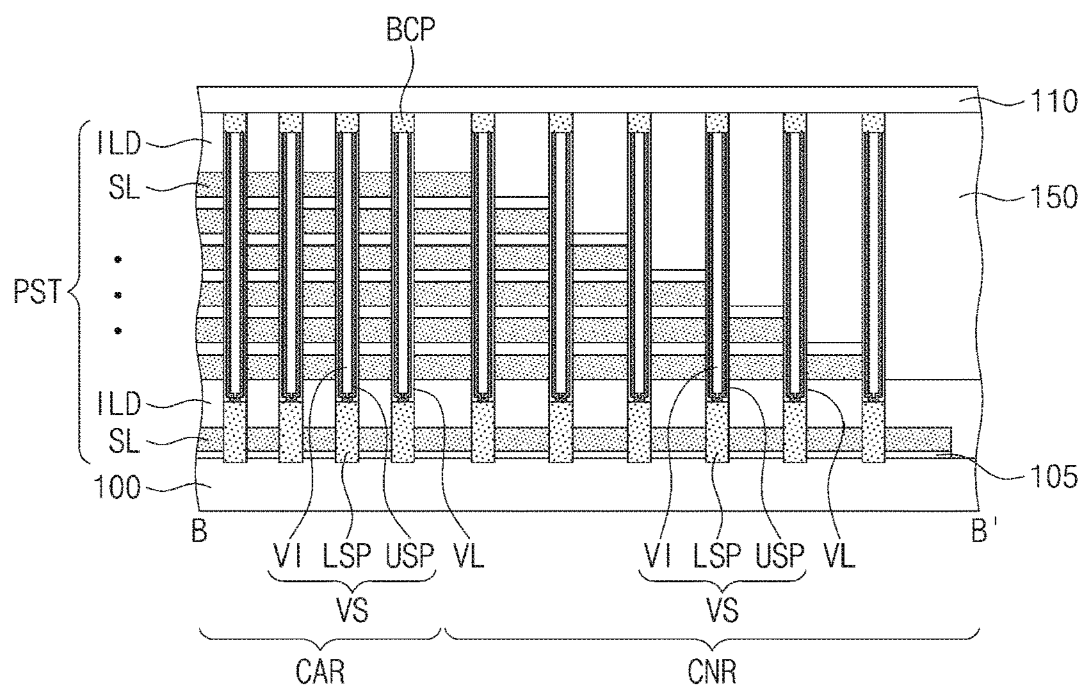

Referring to FIGS. 4A to 4C, the mold structure MS may be patterned to form a plurality of preliminary stack structures PST from the mold structure MS. A trench T may be formed between the preliminary stack structures PST that are adjacent to each other. The formation of the trench T may include forming a first interlayer dielectric layer 110 to cover top surfaces of the vertical channel structures VS, and using the first interlayer dielectric layer 110 as an etching mask to successively etch the sacrificial patterns SL and the dielectric patterns ILD.

The trenches T may extend in the first direction D1 and may be spaced apart from each other in the second direction D2. The trenches T may be spaced apart from the vertical structures VS and may expose sidewalls of the sacrificial patterns SL and of the dielectric patterns ILD. The trenches T may have a linear shape or a rectangular shape. The preliminary stack structures PST may have a linear shape that extends in the first direction D1 along the trench T. The preliminary stack structures PST may be spaced apart in the second direction D2 from each other across the trench T. When the trench T is formed, the top surface of the substrate 100 may be exposed to the trench T and over-etching may cause the exposed top surface to sink to a certain depth.

In some example embodiments, the vertical channel structures VS in one preliminary stack structure PST may be arranged along nine rows that extend in the first direction D1. The vertical channel structures VS arranged on the fifth row may not be connected to a bit line BL which will be discussed below. A separation dielectric layer (not shown) may be formed to extend in the first direction D1 in an upper portion of each of the mold structures MS. The separation dielectric layer may separate one or more of the sacrificial patterns SL disposed at an upper portion of the preliminary stack structure PST.

Figure 5A:
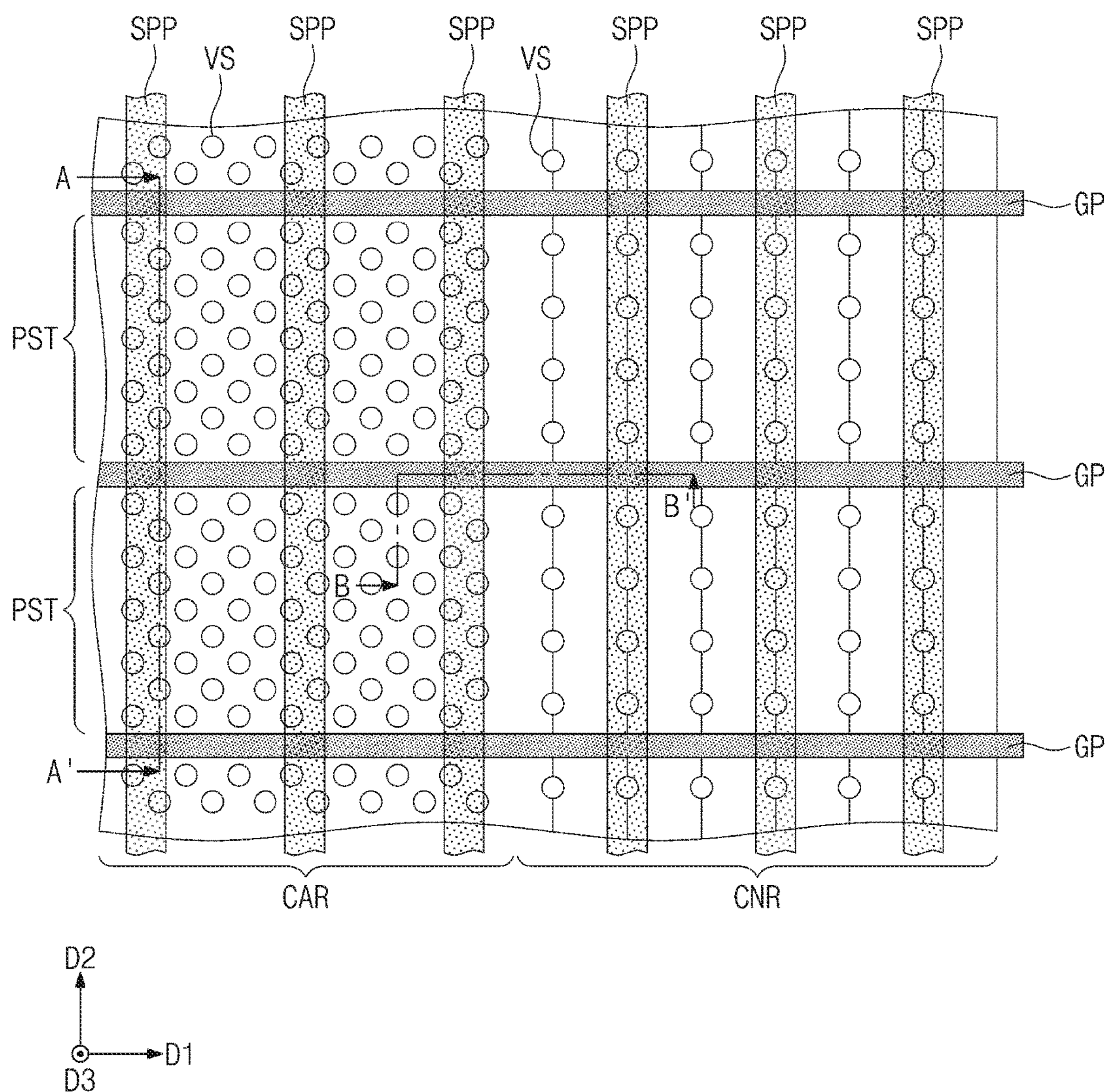
Figure 5B:
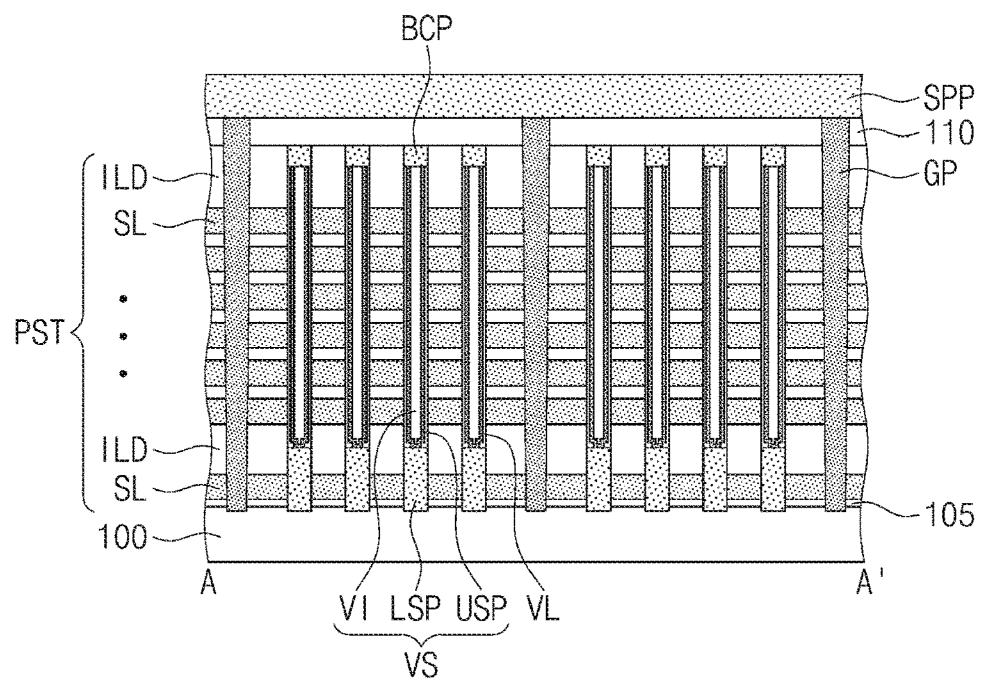
Figure 5C:
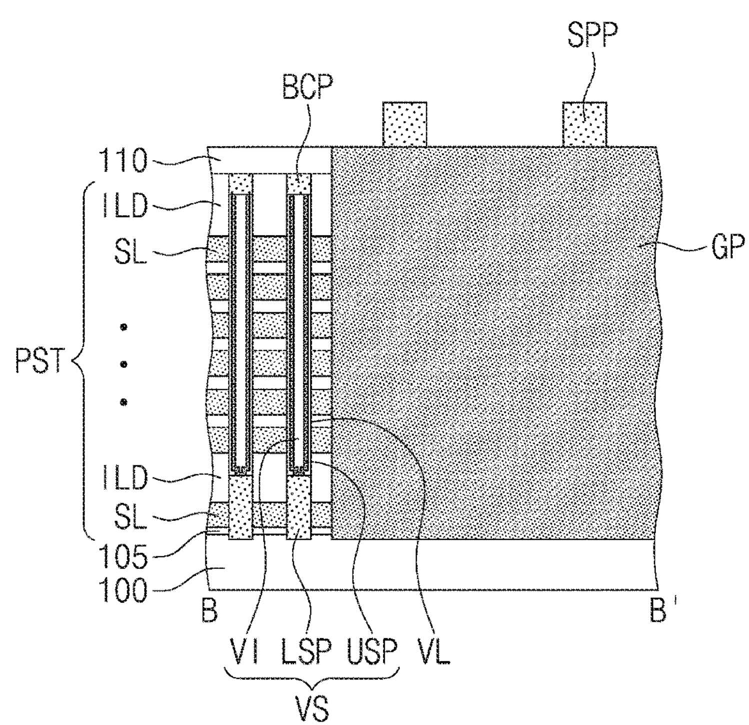

Referring to FIGS. 5A to 5C, a gap-fill pattern GP may be formed between the preliminary stack structures PST. The formation of the gap-fill pattern GP may include forming a gap-fill layer (not shown) to fill the trench T and to cover a top surface of the first interlayer dielectric layer 110, and performing on the gap-fill layer a planarization process to expose the top surface of the first interlayer dielectric layer 110. The gap-fill pattern GP may have a top surface at the same level as that of the top surface of the first interlayer dielectric layer 110. The top surface of the gap-fill pattern GP may be coplanar with the top surface of the first interlayer dielectric layer 110. The gap-fill pattern GP may be formed of a dielectric material having an etch selectivity with respect to the dielectric patterns ILD and the sacrificial patterns SL. The gap-fill pattern GP may include, for example, a silicon-based spin-on-hardmask (SOH) material, a carbon-based amorphous carbon layer (ACL), or a photoresist material.

Support patterns SPP may be formed on the preliminary stack structures PST. The support patterns SPP may expose at least a portion of the top surface of each of the first interlayer dielectric layer 110 and the gap-fill pattern GP. The formation of the support patterns SPP may include forming a support layer (not shown) to cover the top surface of the first interlayer dielectric layer 110 and patterning the support layer to partially expose the top surface of each of the first interlayer dielectric layer 110 and the gap-fill pattern GP.

The support patterns SPP may be arranged along the first direction D1. Each of the support patterns SPP may extend across the preliminary stack structures PST, while extending in a direction that intersects an extending direction (or the first direction D) of the preliminary stack structures PST. The support patterns SPP may connect the preliminary stack structures PST to each other. Accordingly, when subsequent processes are performed, it may be possible to reduce or prevent leaning or collapse of either the preliminary stack structures PST or stack structures ST which will be discussed below.

In some example embodiments, as shown in FIG. 5A, each of the support patterns SPP may extend in the second direction D2 perpendicular to the first direction D1.

The substrate 100 may experience tensile stress created by the preliminary stack structures PST or stack structures ST which will be subsequently formed. The tensile stress from the preliminary stack structures PST may be generated along the extending direction of the preliminary stack structures PST. The tensile stress from the preliminary stack structures PST may cause deflection on an edge of the substrate 100. Because the preliminary stack structures PST extend along the first direction D1, the tensile stress from the preliminary stack structures PST may be applied in the first direction D1. The substrate 100 may thus undergo the anisotropic tensile stress generated by the preliminary stack structures PST.

The support patterns SPP may extend in a direction (or the second direction D2) perpendicular to the extending direction of the preliminary stack structures PST, creating tensile stress in the second direction D2. As a result, it may be possible to reduce a difference between the tensile stress in the first direction D1 and the tensile stress in the second direction D2. The substrate 100 may then be reduced or prevented from asymmetric warpage resulting from the anisotropic tensile stress. The support patterns SPP may include a material that can create tensile stress along an extending direction of the support patterns SPP. The support patterns SPP may include a material whose thermal expansion coefficient is greater than that of the substrate 100. As processes proceed in which variation of temperature is large, the support patterns SPP may provide the tensile stress to the substrate 100. The support patterns SPP may include, for example, a silicon-based dielectric material. The support patterns SPP may include silicon oxide, silicon nitride, or silicon oxynitride as the silicon-based dielectric material. In some example embodiments, a certain process may further be performed to eliminate the deflection of the substrate 100. The deflection of the substrate 100 may become isotropic due to the support patterns SPP. It may then be possible to easily perform the process to eliminate the deflection.

Figure 11A:
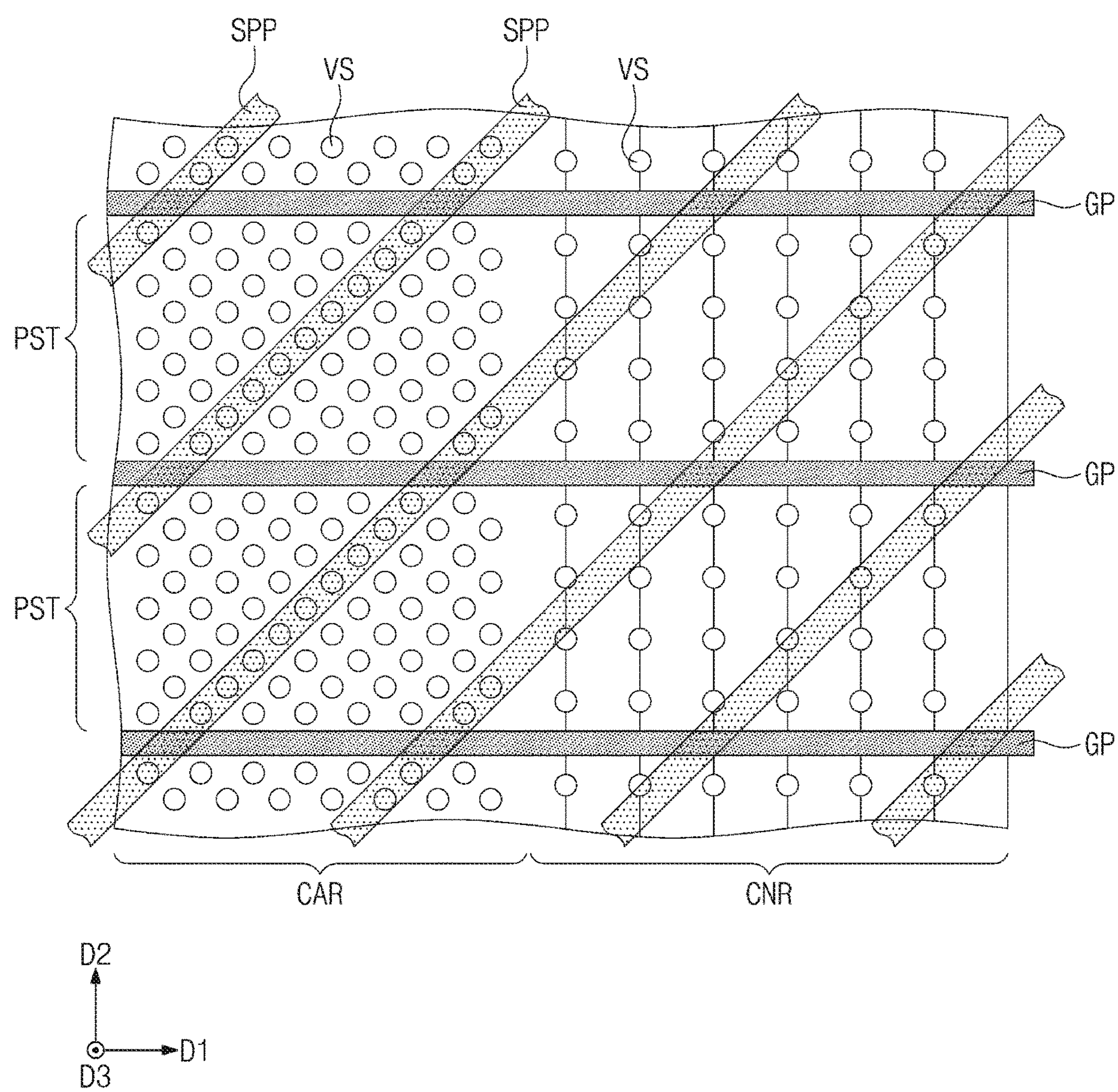
FIGS. 11A and 11B illustrate plan views showing a semiconductor device according to some example embodiments of the present inventive concepts.
Figure 11B:
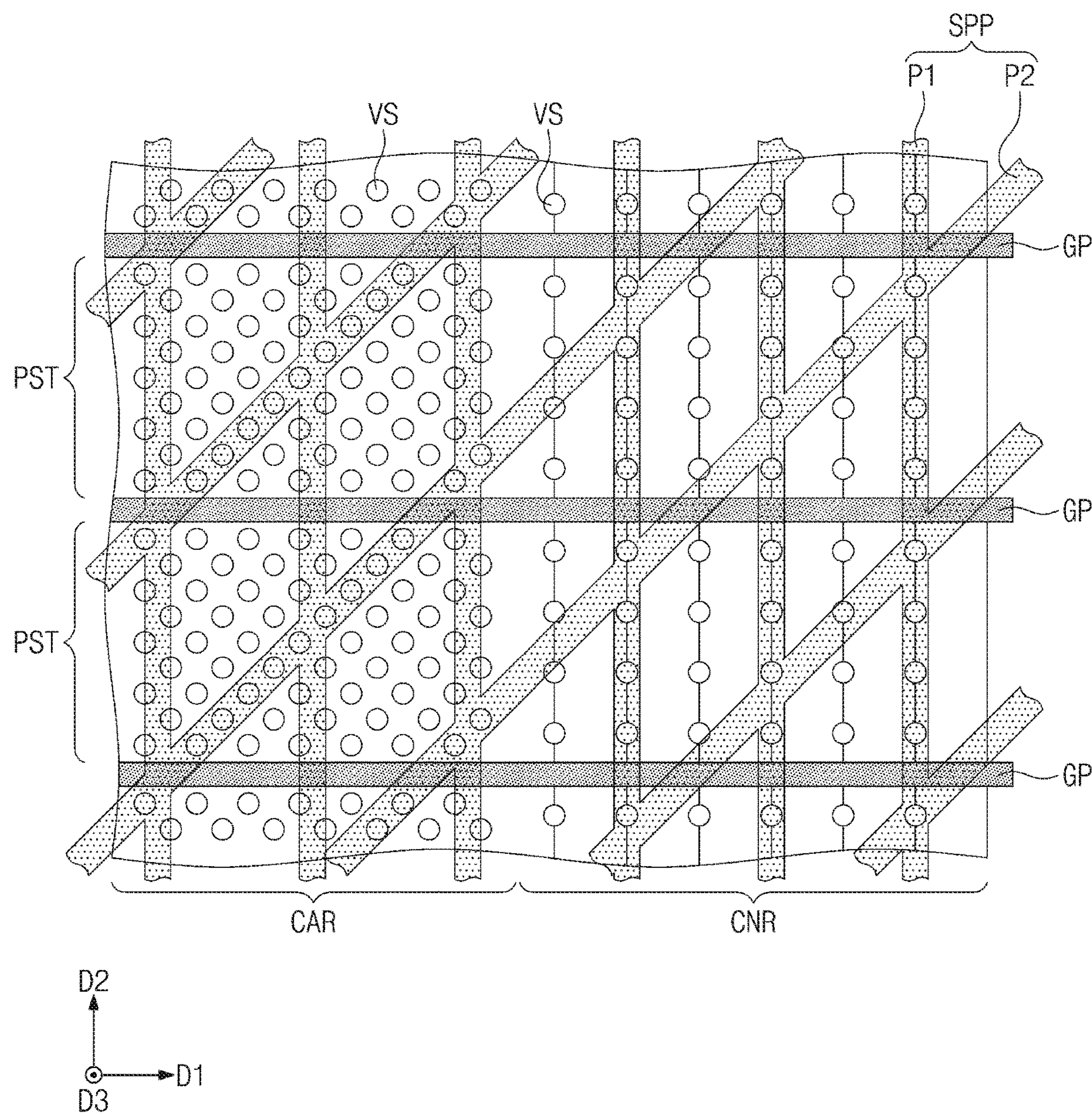

FIGS. 11A and 11B illustrate plan views showing a semiconductor device according to some example embodiments of the present inventive concepts.

In some example embodiments, as shown in FIG. 11A, each of the support patterns SPP may extend in a direction inclined (angled other than perpendicular) to the first direction D1. For example, each of the support patterns SPP may obliquely extend across the preliminary stack structures PST. The support patterns SPP may include a material whose rigidity is higher. The support patterns SPP may include, for example, metal such as tungsten, copper, or aluminum. In some example embodiments, the support patterns SPP may include a material that can create compressive stress in the extending direction of the support patterns SPP. The support patterns SPP may include a material whose thermal expansion coefficient is smaller than that of the substrate 100. As processes proceed in which variation of temperature is large, the support patterns SPP may provide the compressive stress to the substrate 100. The support patterns SPP may counterbalance the tensile stress in the first direction D1 caused by the preliminary stack structures PST. The substrate 100 may then be reduced or prevented from deflection.

In some example embodiments, as shown in FIG. 11B, the support pattern SPP may have a mesh shape (more than one angle other than perpendicular). For example, the support pattern SPP may include a first segment P1 that extends in the second direction D2. The support pattern SPP may also include a second segment P2 that extend in a direction inclined (angled other than perpendicular) to the first and second directions D1 and D2. The support pattern SPP may include, for example, metal whose rigidity is higher.

Figure 6A:
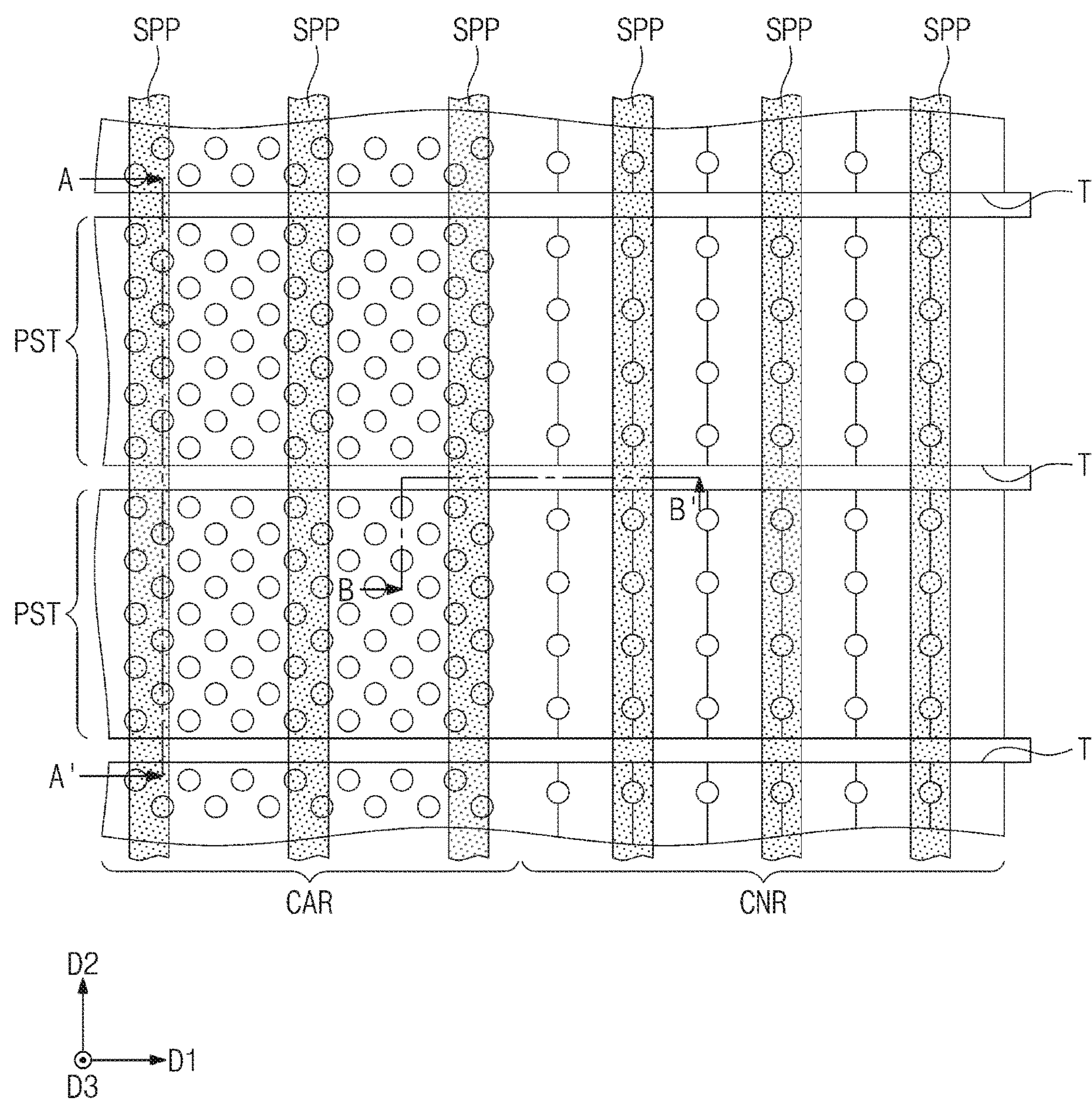
Figure 6B:
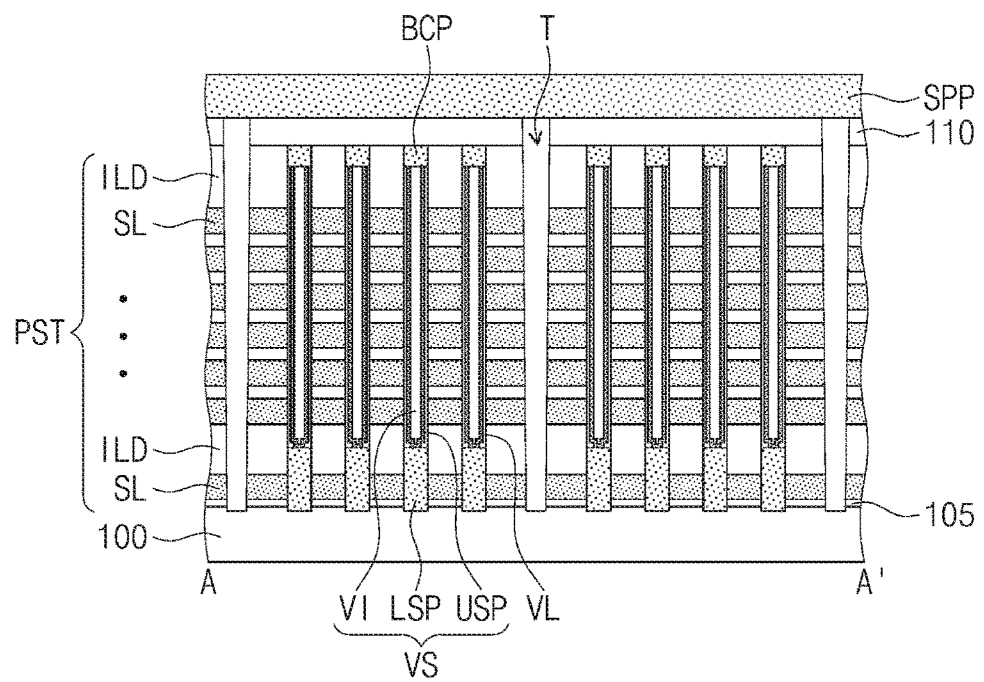
Figure 6C:
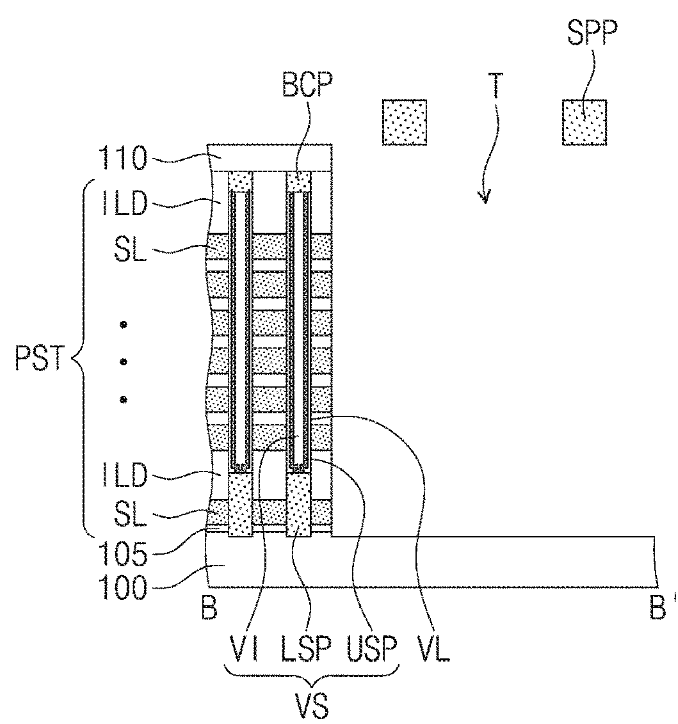
Figure 7A:
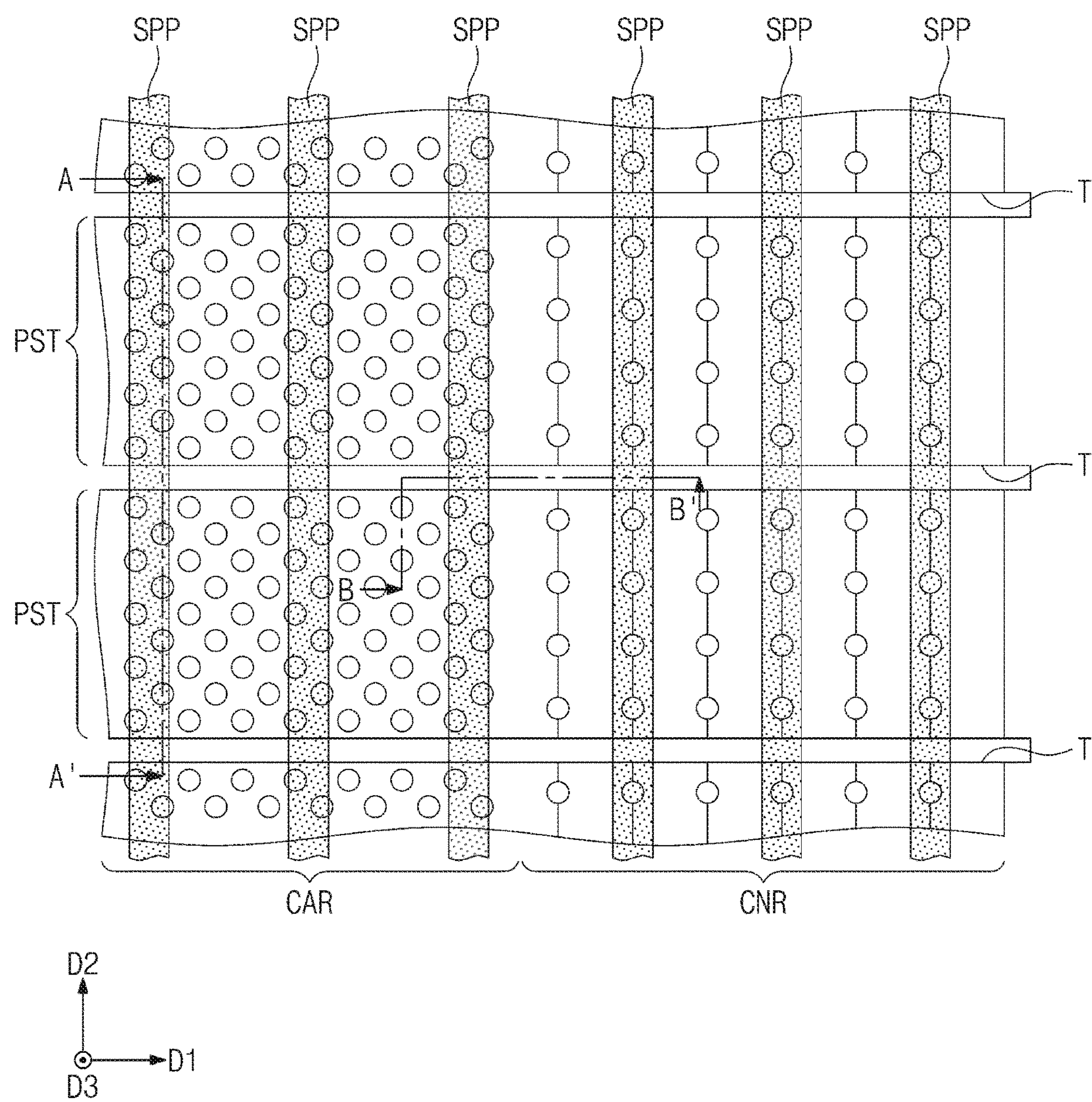
Figure 7B:
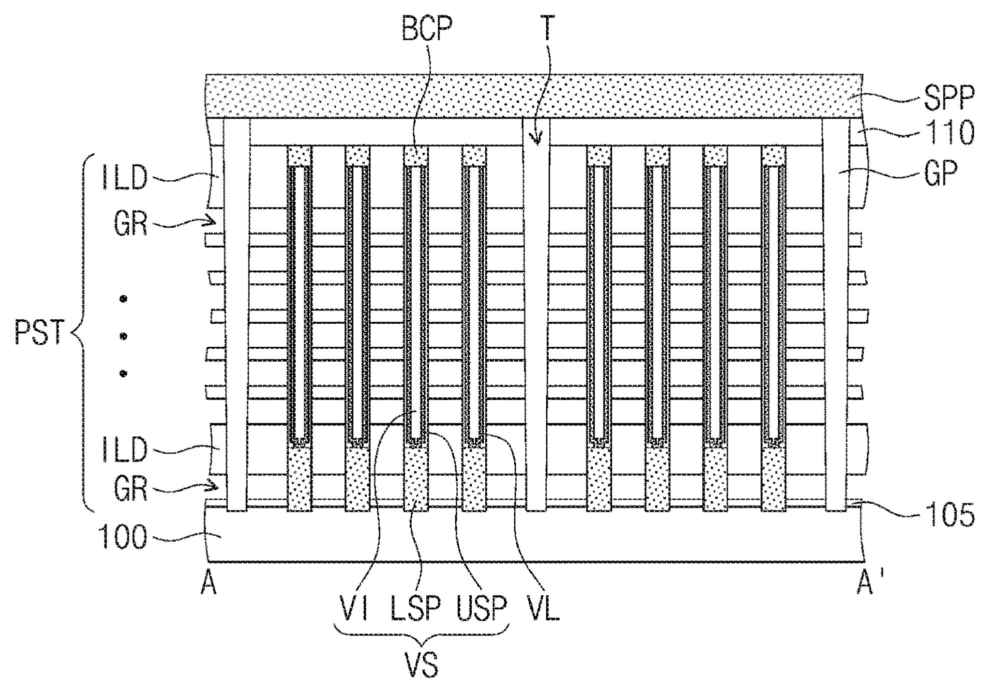
Figure 7C:
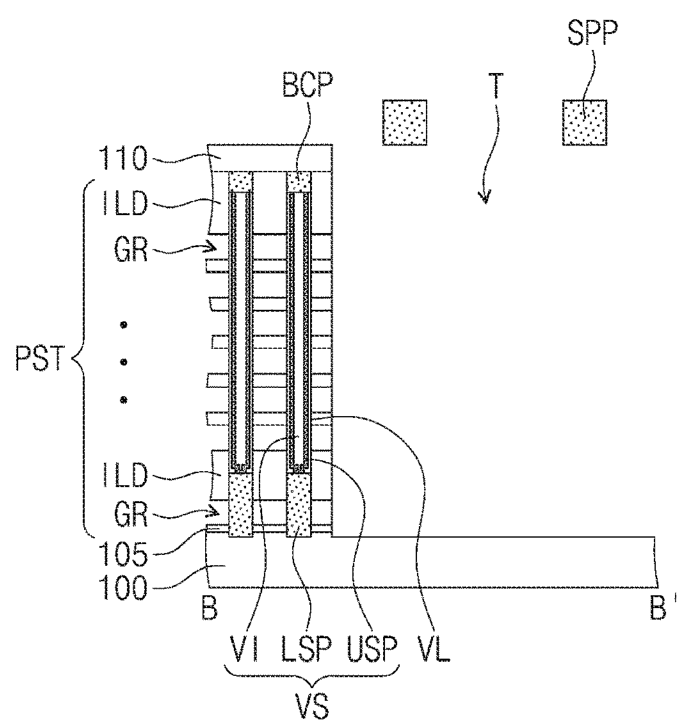

Referring to FIGS. 6A to 6C, the gap-fill pattern GP may be removed to expose side surfaces of the preliminary stack structures PST. The removal of the gap-fill pattern GP may be achieved by an wet etching process having an etch selectivity with respect to the preliminary stack structure PST, the buffer dielectric layer 105, the first interlayer dielectric layer 110, and the support pattern SPP. The removal of the gap-fill pattern GP may partially expose a bottom surface of the support pattern SPP.

Referring to FIGS. 7A to 7C and 8A to 8C, stack structures ST may be formed from the preliminary stack structures PST. Each of the stack structures ST may include electrodes EL and the dielectric patterns ILD that are alternately stacked. The formation of the stack structures ST may include replacing the sacrificial patterns SL with the electrodes EL.

Figure 8A:
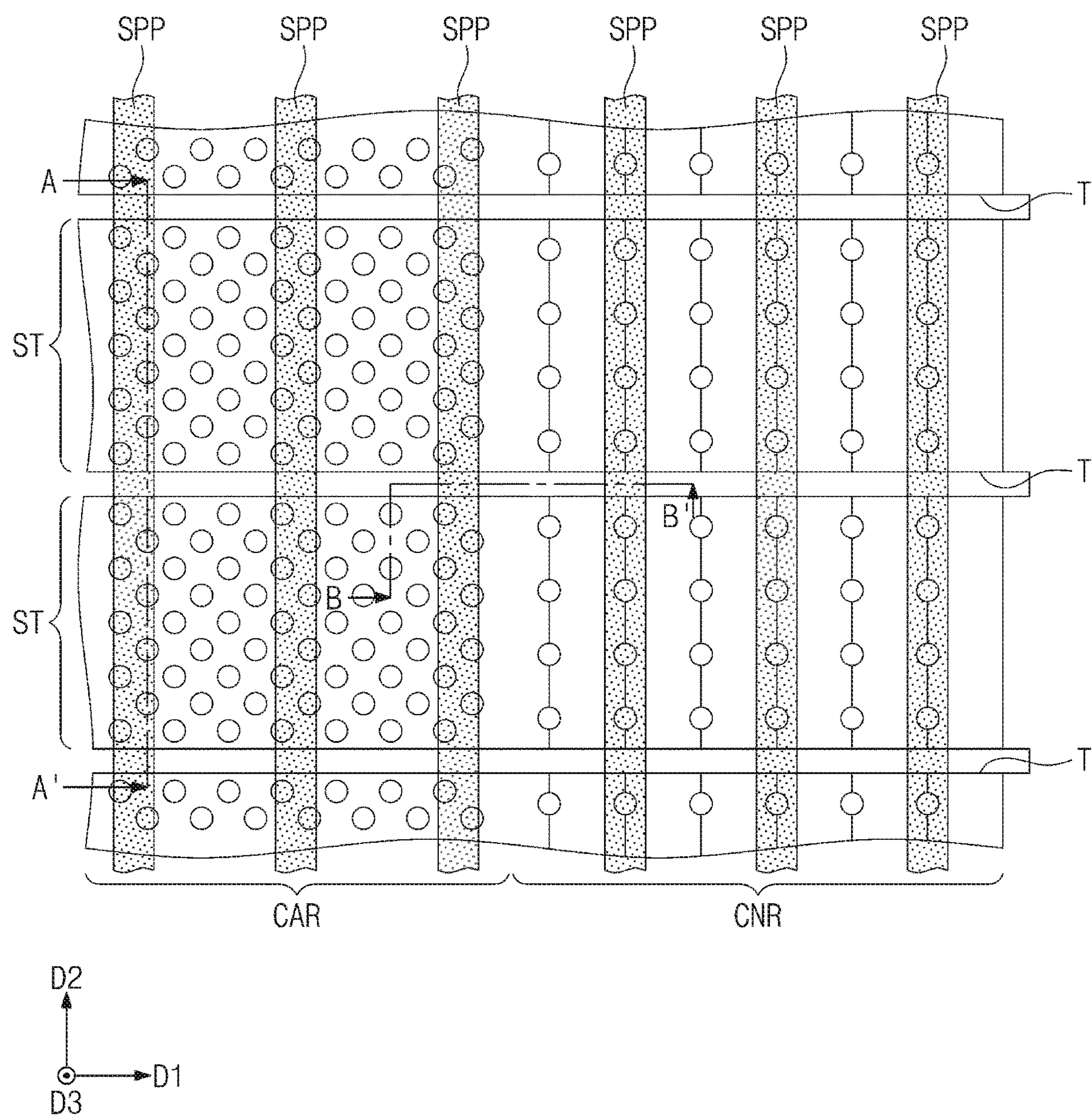
Figure 8B:
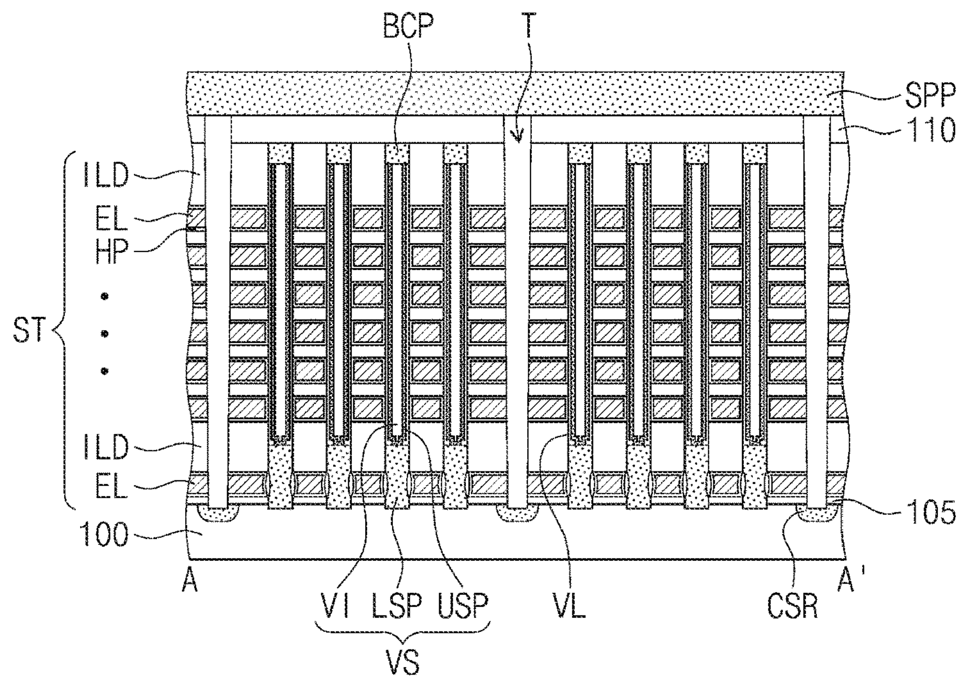
Figure 8C:
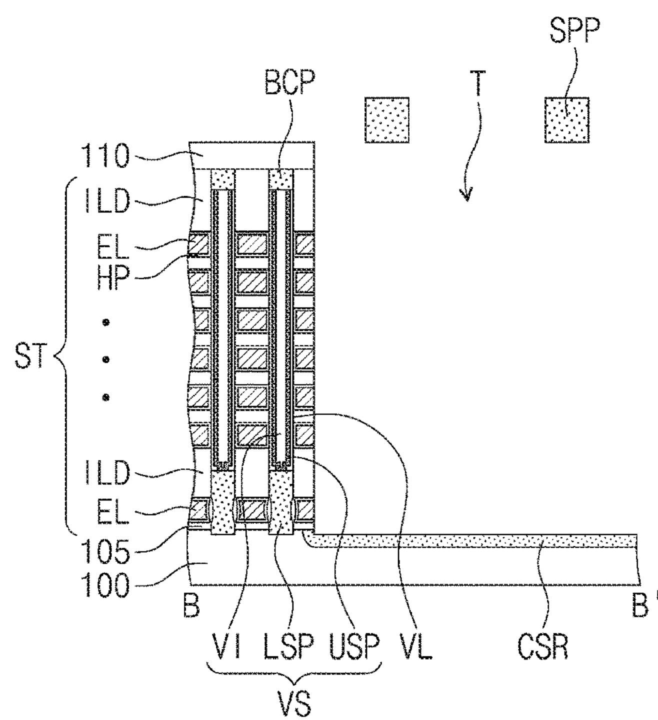

The replacement of the sacrificial patterns SL with the electrodes EL may include forming gate regions GR between the dielectric patterns ILD by removing the sacrificial patterns SL exposed to the trenches T (see FIGS. 7B and 7C), and forming the electrodes EL in corresponding gate regions GR (see FIGS. 8B and 8C). The formation of the gate regions GR may include performing an isotropic etching process in which the sacrificial patterns SL are isotropically etched using a recipe that has an etch selectivity with respect to the planarized dielectric layer 150, the dielectric patterns ILD, the vertical channel structures VS, the first interlayer dielectric layer 110, and the support pattern SPP. The isotropic etching process may completely remove the sacrificial patterns SL. For example, when the sacrificial patterns SL are silicon nitride layers and the dielectric patterns ILD are silicon oxide layers, the isotropic etching process may use an etchant containing phosphoric acid.

A gate dielectric layer (not designated by a reference numeral) may be formed on a sidewall of the lower semiconductor pattern LSP exposed to a lowermost gate region GR. The gate dielectric layer may be formed by a heat treatment process performed under a gas atmosphere including oxygen atoms.

The electrodes EL may be formed in the gate regions GR. Before the electrodes EL are formed, horizontal dielectric layers HP may be formed to conformally cover inner walls of empty spaces (or the gate regions GR) between the dielectric patterns ILD. The replacement of the sacrificial patterns SL with the electrodes EL may form the stack structures ST each of which includes the dielectric patterns ILD and the electrodes EL that are alternately stacked on the substrate 100.

Common source regions CSR may be formed in the substrate 100 between the stack structures ST. The formation of the common source regions CSR may include that the substrate 100 exposed to the trenches T is doped with impurities having a second conductivity (e.g., n-type) different from the first conductivity. The common source regions CSR may extend in parallel along the first direction D1 and may be spaced apart from each other in the second direction D2.

Figure 9A:
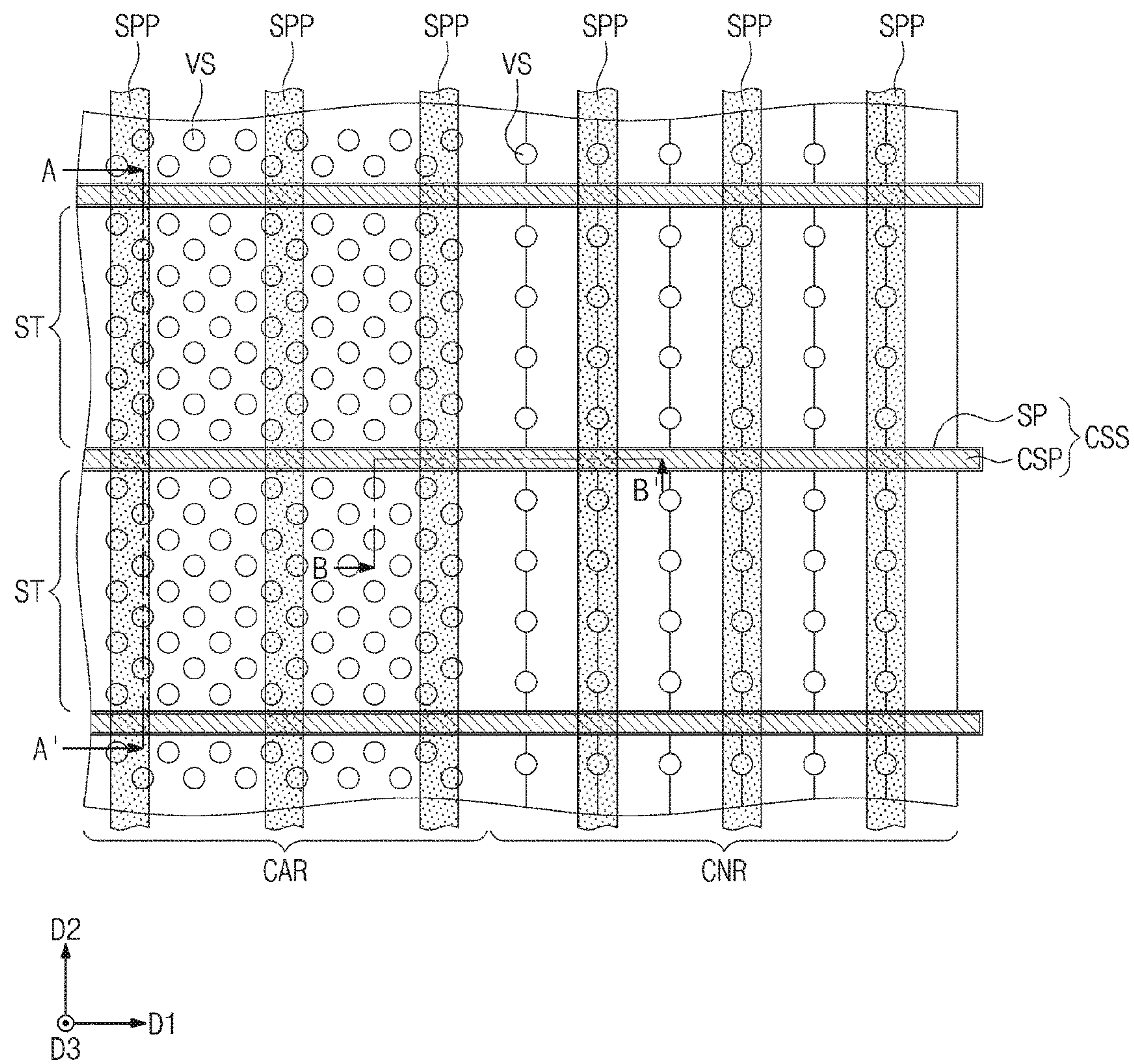
Figure 9B:
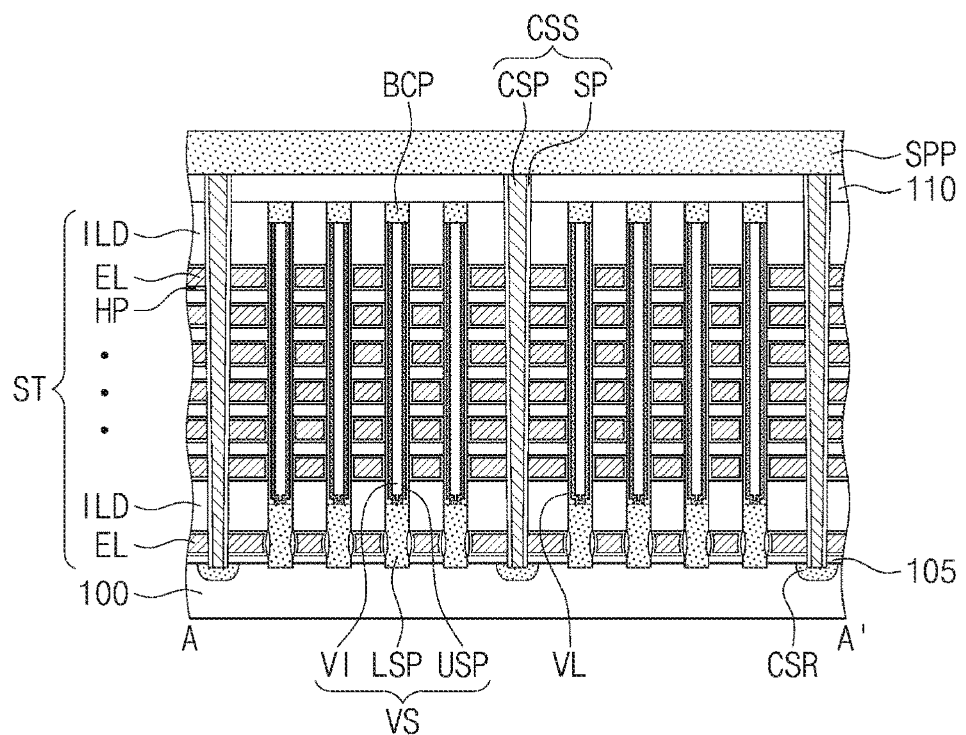
Figure 9C:
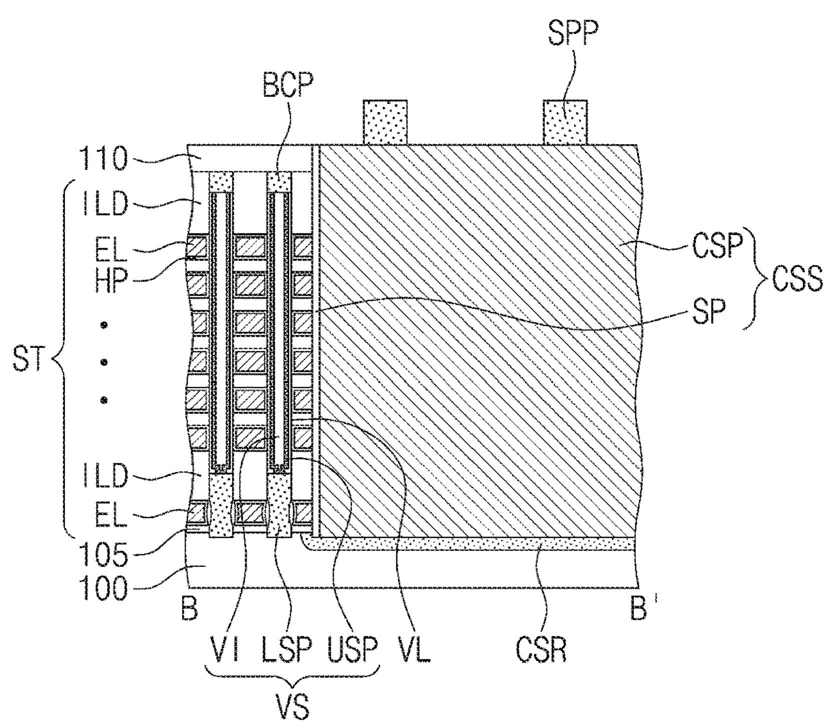

Referring to FIGS. 9A to 9C, separation structures CSS may be formed in the trenches T. In some example embodiments, the separation structure CSS may include a common source plug CSP coupled to the common source region CSR and a dielectric spacer SP between the common source plug CSP and the stack structures ST.

For example, the dielectric spacer SP may be formed on sidewalls of the trenches T. The formation of the dielectric spacer SP may include depositing a spacer layer to have a uniform thickness on the substrate 100 on which the stack structures ST are formed, and then performing on the spacer layer an etch-back process to expose the common source region CSR. The spacer layer may include a dielectric material.

The common source plug CSP may be formed in the trench T in which the dielectric spacer SP is formed. The common source plug CSP may be disposed between facing sidewalls of the stack structures ST and may extend in the first direction D1.

Figure 10A:
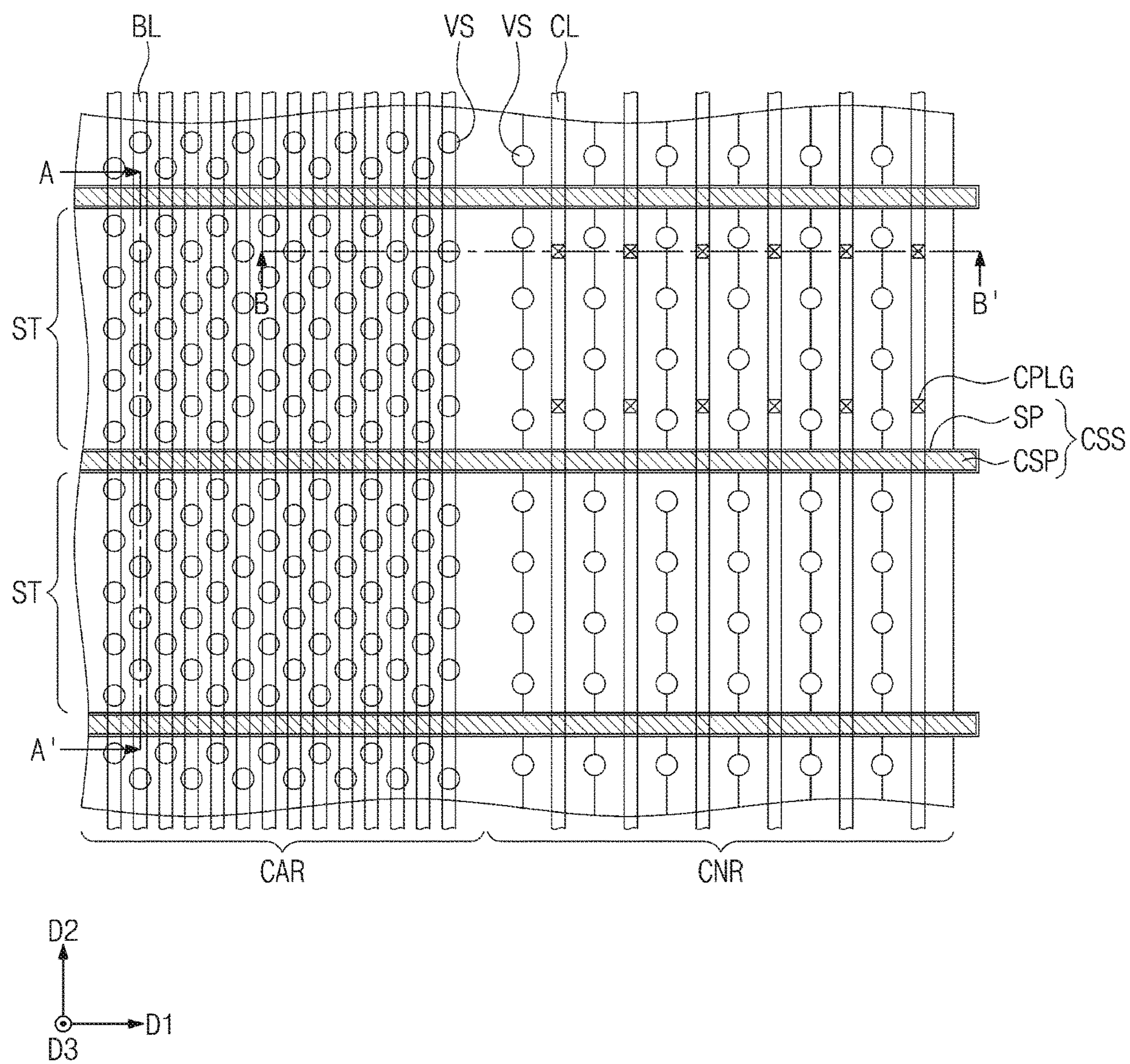
Figure 12A:
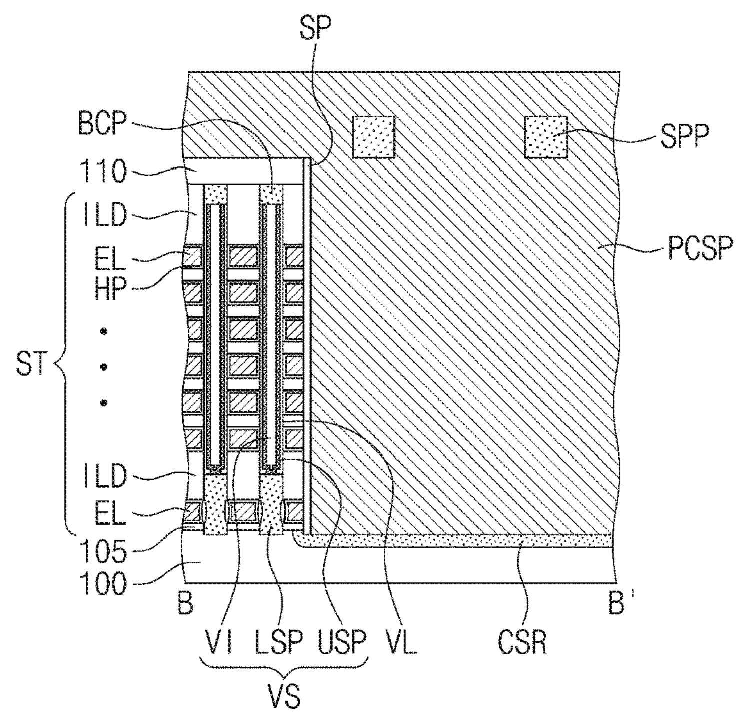
FIGS. 12A and 12B illustrate cross-sectional views taken along line A-A' of FIG. 10A, showing a method of fabricating a semiconductor device according to some example embodiments of the present inventive concepts.
Figure 12B:
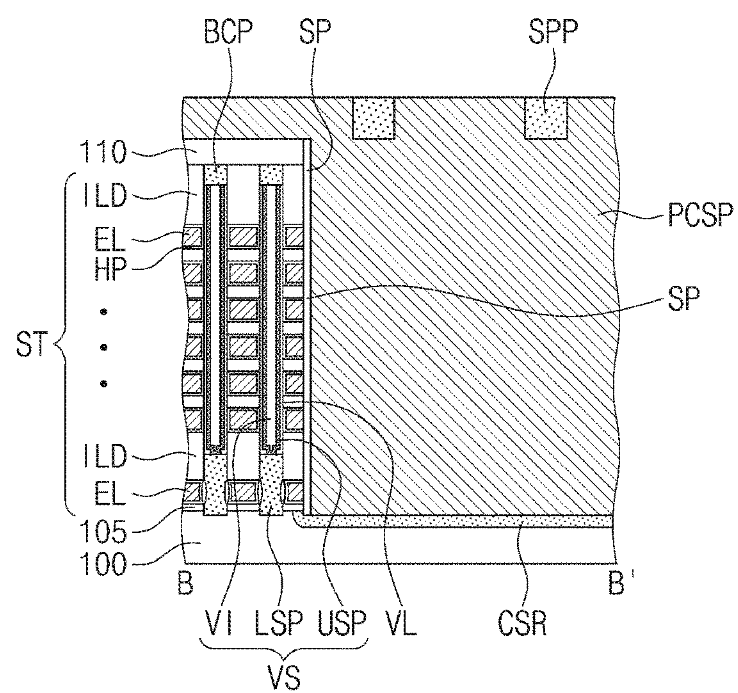

FIGS. 12A and 12B illustrate cross-sectional views taken along line A-A' of FIG. 10A, showing a method of fabricating a semiconductor device according to some example embodiments of the present inventive concepts. As shown in FIGS. 12A and 12B, the formation of the common source plug (see CSP of FIG. 9C) may include forming a metal layer PCSP, performing on the metal layer PCSP a planarization process to expose a top surface of the support pattern SPP, and using the support pattern SPP as an etching mask to etch the planarized metal layer PCSP.

Figure 10B:
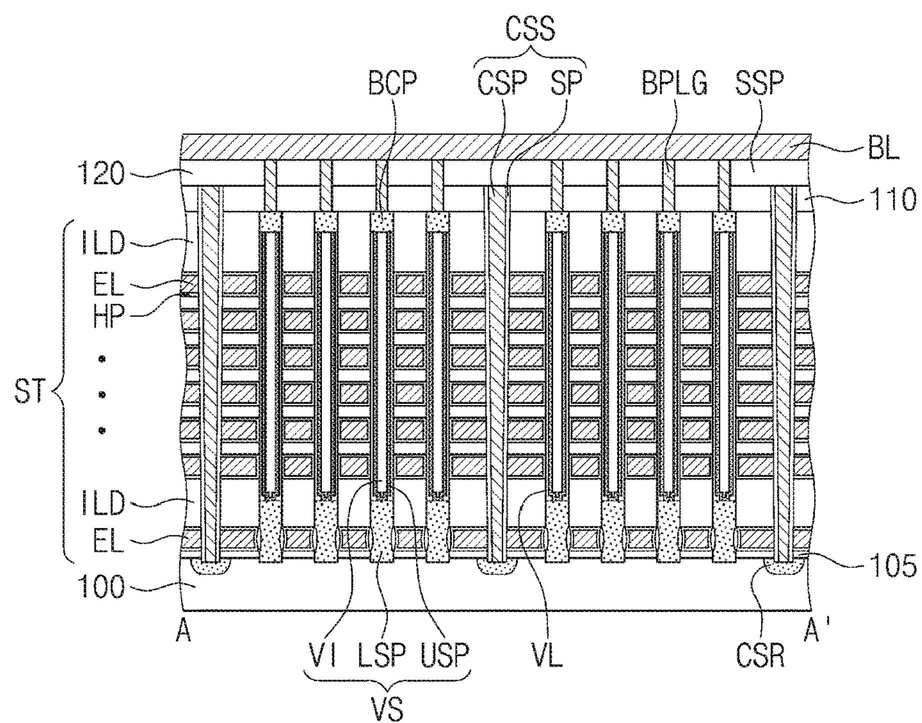
Figure 10C:
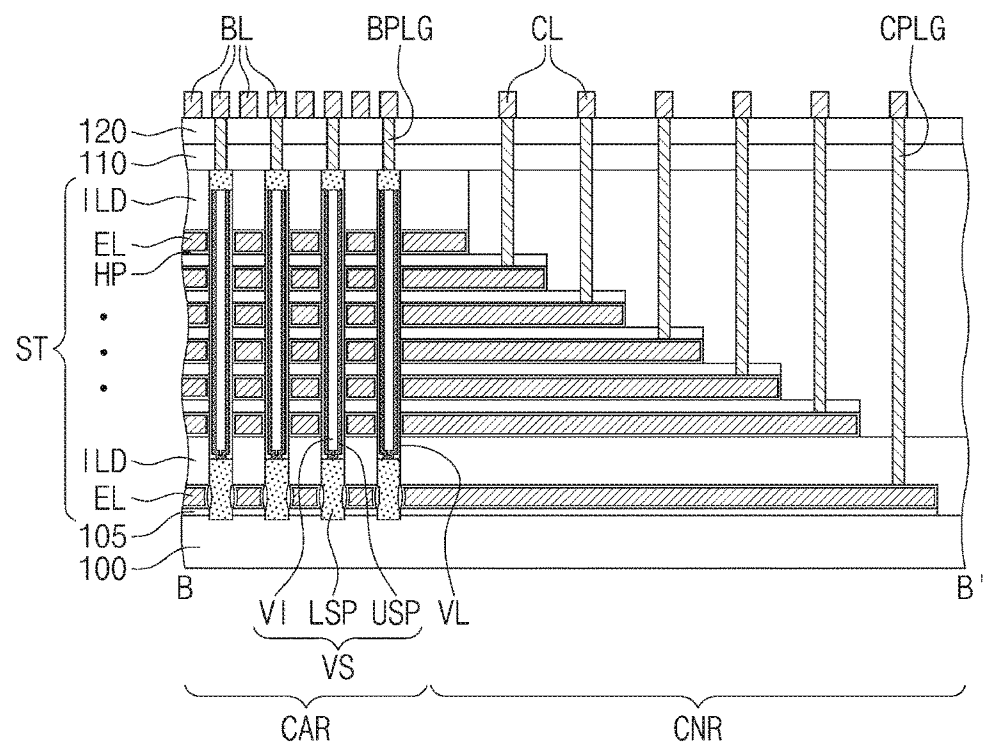

Referring to FIGS. 10A to 10C, the support patterns SPP may be removed. The removal of the support patterns SPP may completely expose the top surface of the first interlayer dielectric layer 110 and a top surface of the separation structure CSS. A second interlayer dielectric layer 120 may be formed on the first interlayer dielectric layer 110. The second interlayer dielectric layer 120 may cover the top surface of the separation structure CSS. Bit lines BL may be formed on the second interlayer dielectric layer 120 of the cell array region CAR. The bit lines BL may extend in the second direction D2 and may be arranged in the first direction D1. The bit lines BL may be electrically connected to the vertical channel structures VS through bit line contact plugs BPLG that penetrate the first and second interlayer dielectric layers 110 and 120.

Connection lines CL may be formed on the second interlayer dielectric layer 120 of the connection region CNR. The connection lines CL may be correspondingly coupled to pads of the electrodes EL through cell contact plugs CPLG that penetrate the first and second interlayer dielectric layers 110 and 120 and the planarized dielectric layer 150. The cell contact plugs CPLG may have their vertical lengths that decrease with decreasing distance from the cell array region CAR. The cell contact plugs CPLG may have their top surfaces substantially coplanar with each other.

Figure 13A:
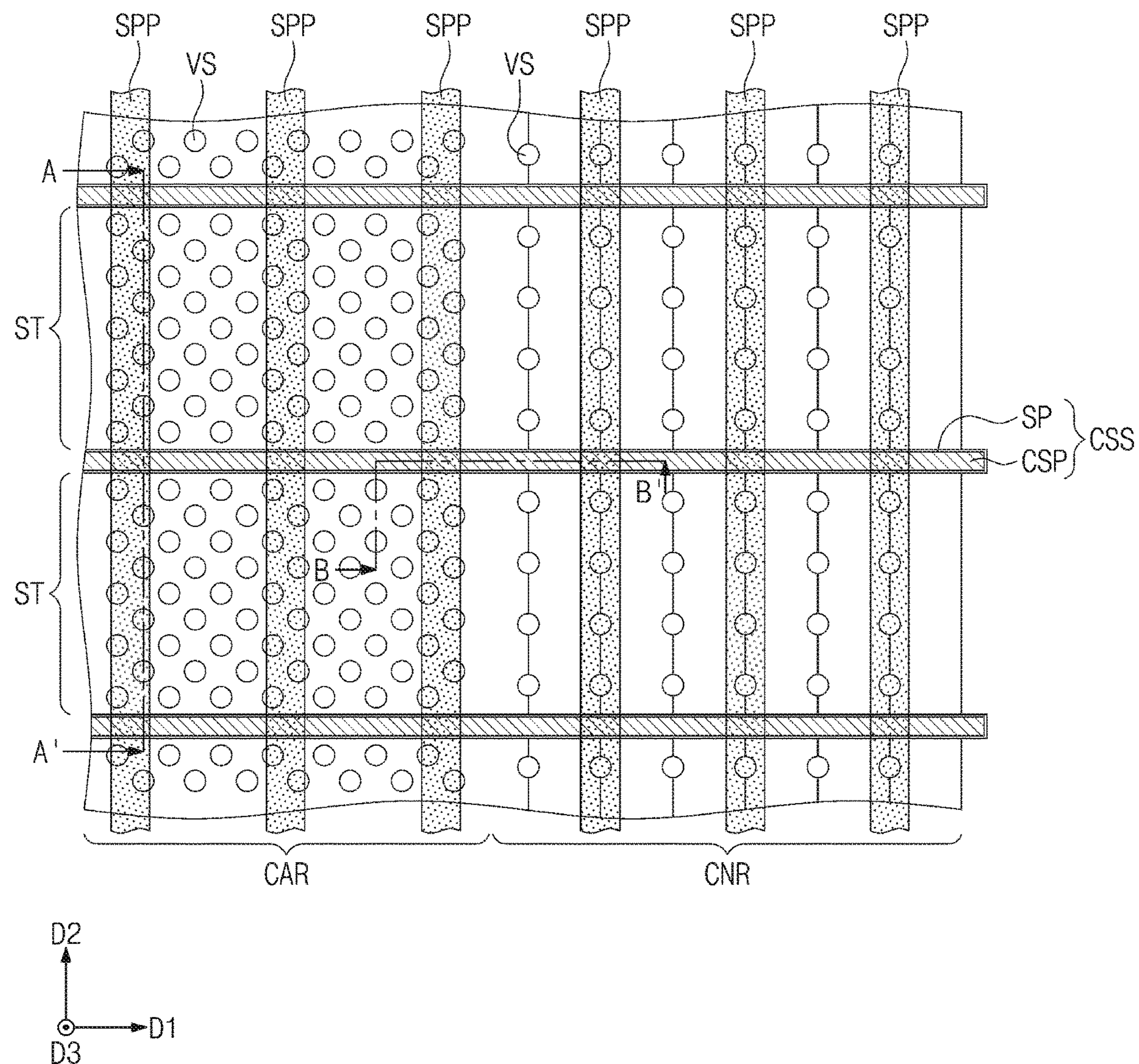
FIGS. 13A and 14A illustrate plan views showing a method of fabricating a semiconductor device according to some example embodiments of the present inventive concepts.
Figure 13B:
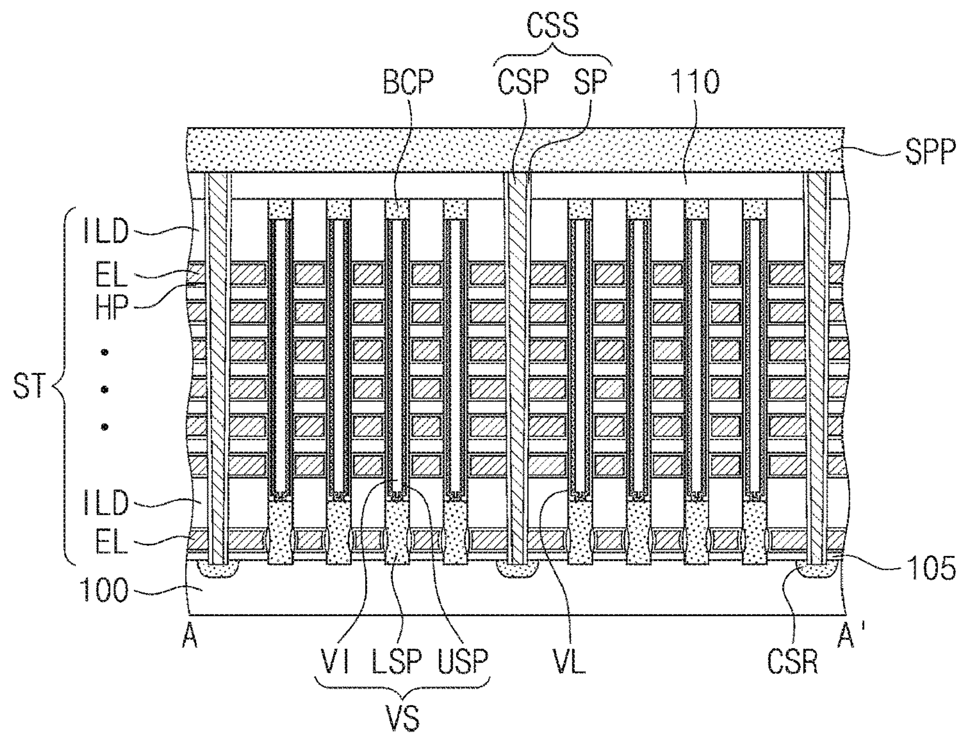
FIGS. 13B and 14B illustrate cross-sectional views taken along line A-A' of FIGS. 13A and 14A, respectively, showing a method of fabricating a semiconductor device according to some example embodiments of the present inventive concepts.
Figure 13C:
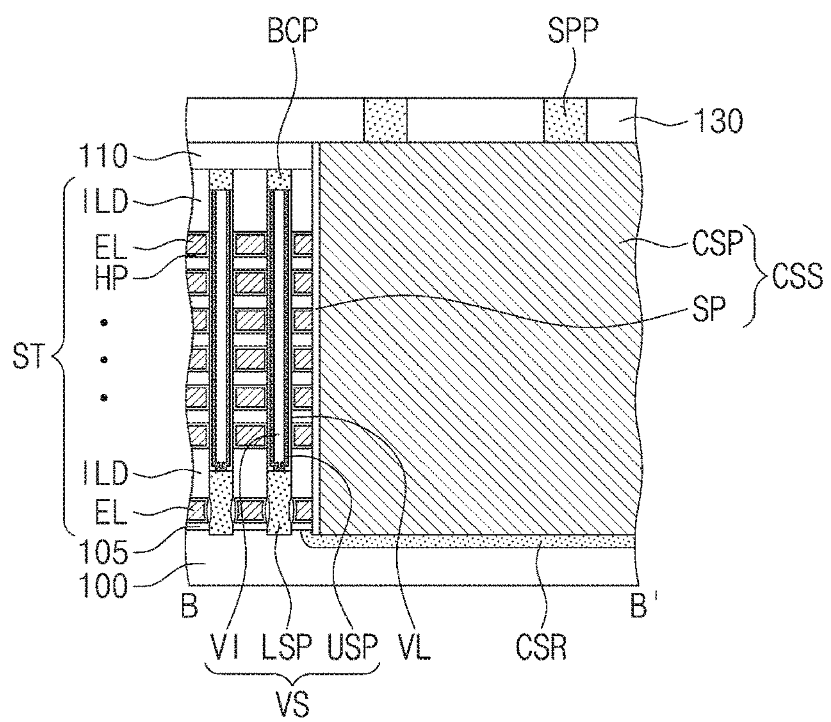
FIGS. 13C and 14C illustrate cross-sectional views taken along line B-B' of FIGS. 13A and 14A, respectively, showing a method of fabricating a semiconductor device according to some example embodiments of the present inventive concepts.
Figure 14A:
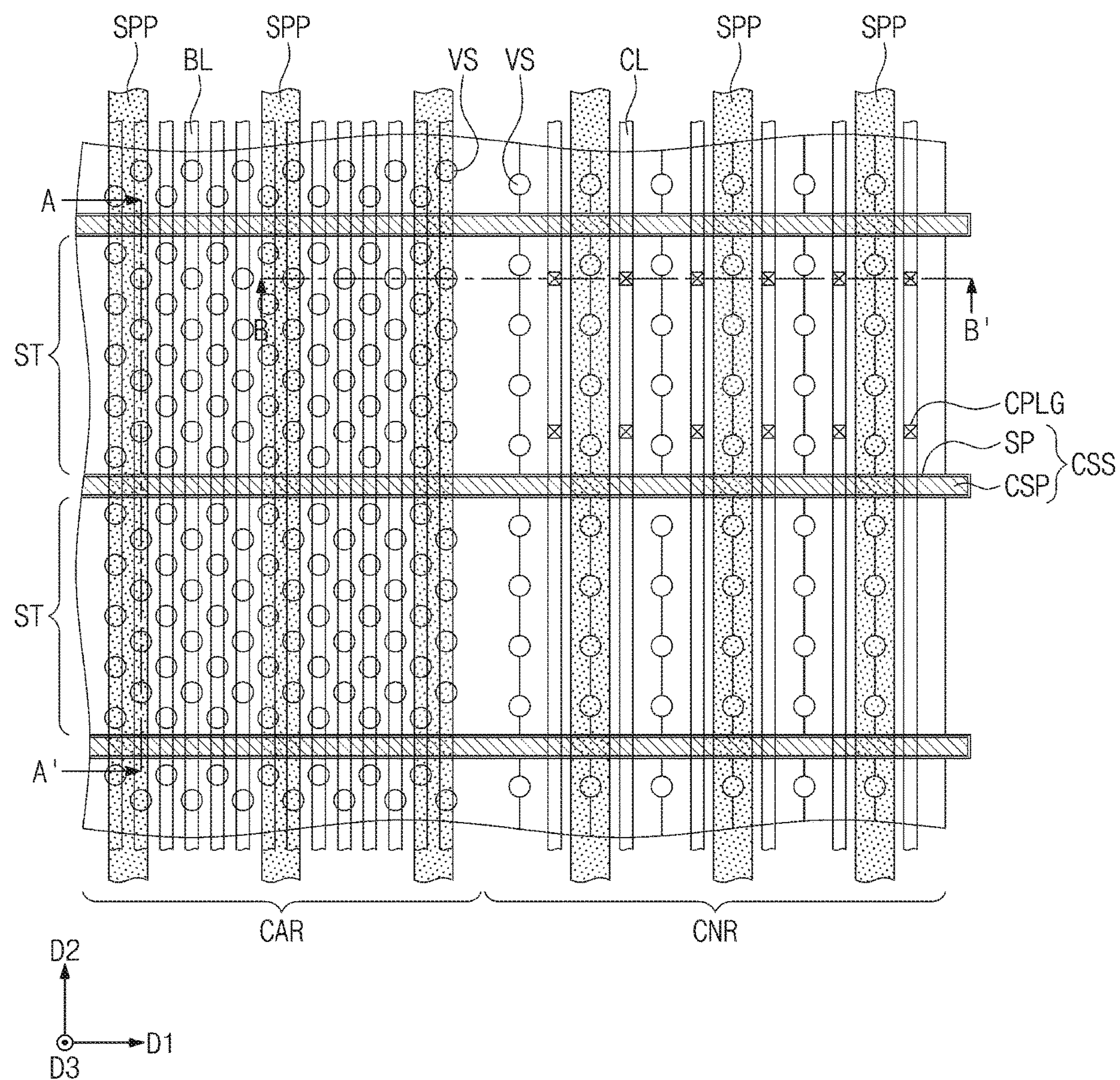
Figure 14B:
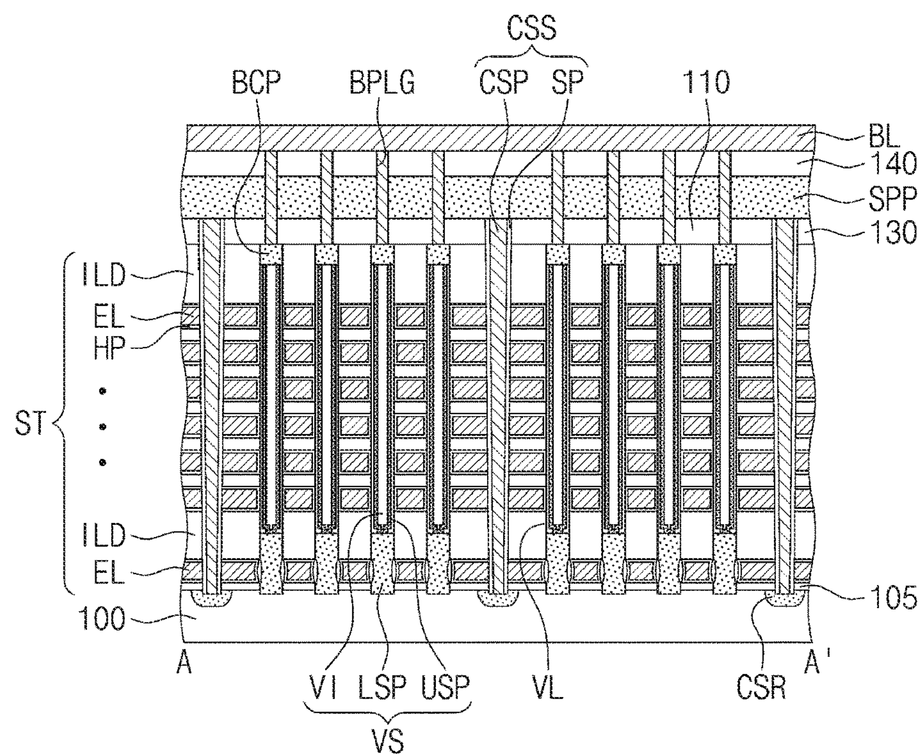
Figure 14C:
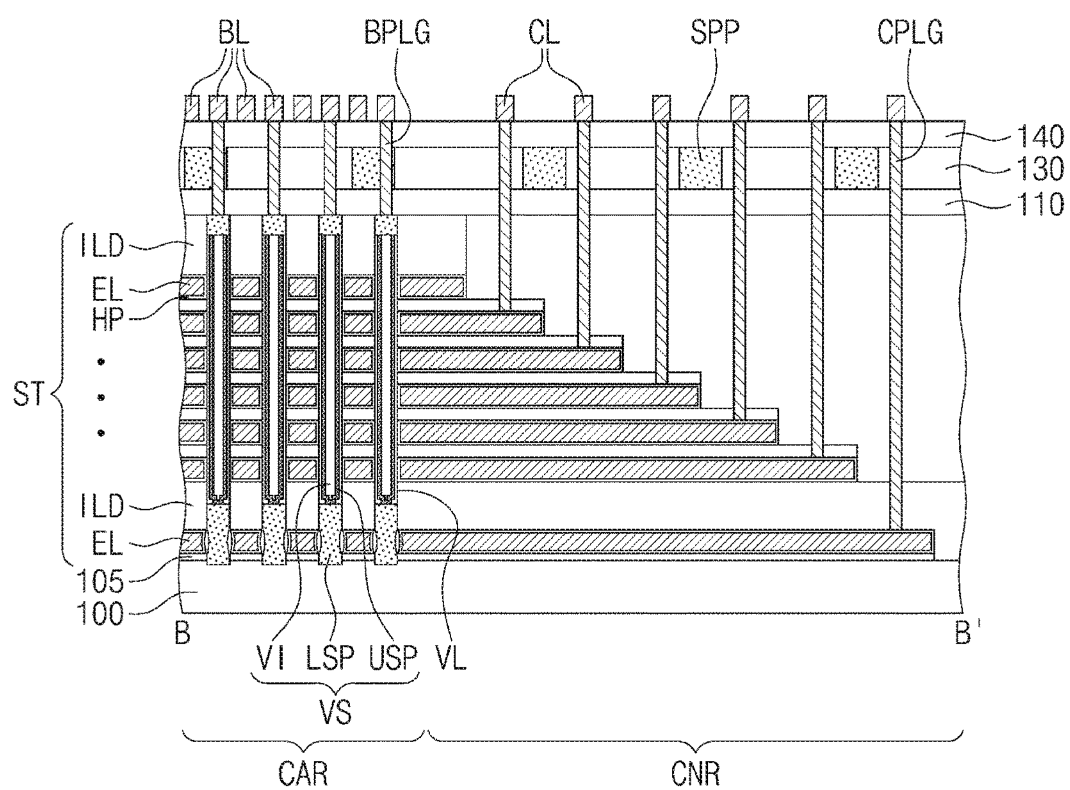

FIGS. 13A and 14A illustrate plan views showing a method of fabricating a semiconductor device according to some example embodiments of the present inventive concepts. FIGS. 13B and 14B illustrate cross-sectional views taken along line A-A' of FIGS. 13A and 14A, respectively, showing a method of fabricating a semiconductor device according to some example embodiments of the present inventive concepts. FIGS. 13C and 14C illustrate cross-sectional views taken along line B-B' of FIGS. 13A and 14A, respectively, showing a method of fabricating a semiconductor device according to some example embodiments of the present inventive concepts.

Referring to FIGS. 13A to 13C, differently from that discussed with reference to FIGS. 10A to 10C, the support patterns SPP may not be removed.

For example, the support patterns SPP may be formed on the stack structures ST and the separation structures CSS. A third interlayer dielectric layer 130 may be formed on the first interlayer dielectric layer 110. The formation of the third interlayer dielectric layer 130 may include forming on the first interlayer dielectric layer 110 a preliminary third interlayer dielectric layer (not shown) to cover the side and top surfaces of the support patterns SPP, and performing on the preliminary third interlayer dielectric layer a planarization process to expose the top surfaces of the support patterns SPP. The third interlayer dielectric layer 130 may include, for example, silicon oxide, silicon nitride, or silicon oxynitride.

The third interlayer dielectric layer 130 may cover the top surface of the separation structure CSS. The third interlayer dielectric layer 130 may cover the side surfaces of the support patterns SPP. The third interlayer dielectric layer 130 may have a top surface at the same level as that of the top surfaces of the support patterns SPP. The top surface of the third interlayer dielectric layer 130 may be coplanar with the top surfaces of the support patterns SPP.

Referring to FIGS. 14A to 14C, a fourth interlayer dielectric layer 140 may be formed on the third interlayer dielectric layer 130. The bit lines BL may be formed on the fourth interlayer dielectric layer 140 of the cell array region CAR. The bit lines BL may extend in the second direction D2 and may be arranged in the first direction D1. Ones of the bit lines BL may vertically overlap the support pattern SPP. The bit lines BL may be electrically connected to the vertical channel structures VS through the bit line contact plugs BPLG that penetrate the first, third, and fourth interlayer dielectric layers 110, 130, and 140. Ones of the bit line contact plugs BPLG may penetrate the support pattern SPP.

The connection lines CL may be formed on the fourth interlayer dielectric layer 140 of the connection region CNR. The connection lines CL may be electrically connected to the electrodes EL through the cell contact plugs CPLG that penetrate the first, third, and fourth interlayer dielectric layers 110, 130, and 140.

Figure 15:
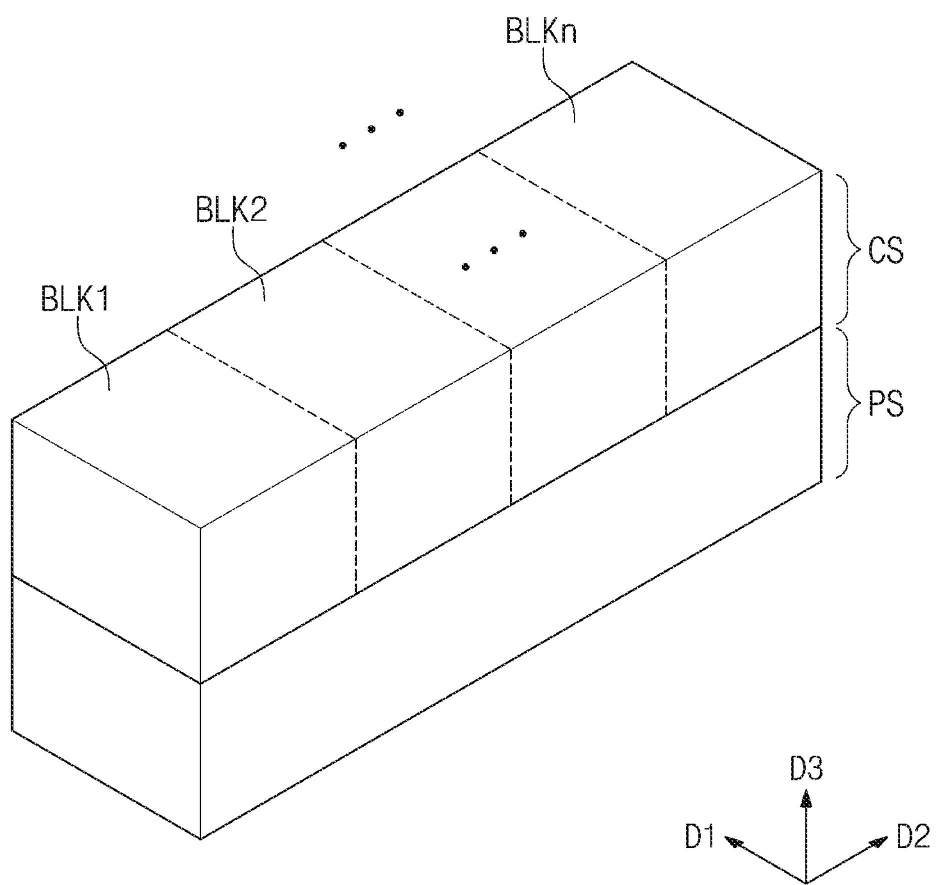
FIG. 15 illustrates a simplified block diagram showing a semiconductor device according to some example embodiments of the present inventive concepts.

FIG. 15 illustrates a simplified block diagram showing a semiconductor device according to some example embodiments of the present inventive concepts.

Referring to FIG. 15, a semiconductor device may include a peripheral logic structure PS and a cell array structure CS, which cell array structure CS may be stacked on the peripheral logic structure PS. For example, when viewed in plan, the peripheral logic structure PS and the cell array structure CS may overlap each other.

In some example embodiments, the peripheral logic structure PS may include row and column decoders, a page buffer, and/or control circuits, as discussed with reference to FIG. 1. The cell array structure CS may include a plurality of memory blocks BLK1 to BLKn each of which is a data erase unit. Each of the memory blocks BLK1 to BLKn may include a structure in which word lines are stacked along a third direction D3 on a plane elongated along first and second directions D1 and D2. Each of the memory blocks BLK1 to BLKn may include a memory cell array having a three-dimensional structure (or a vertical structure).

Figure 16A:
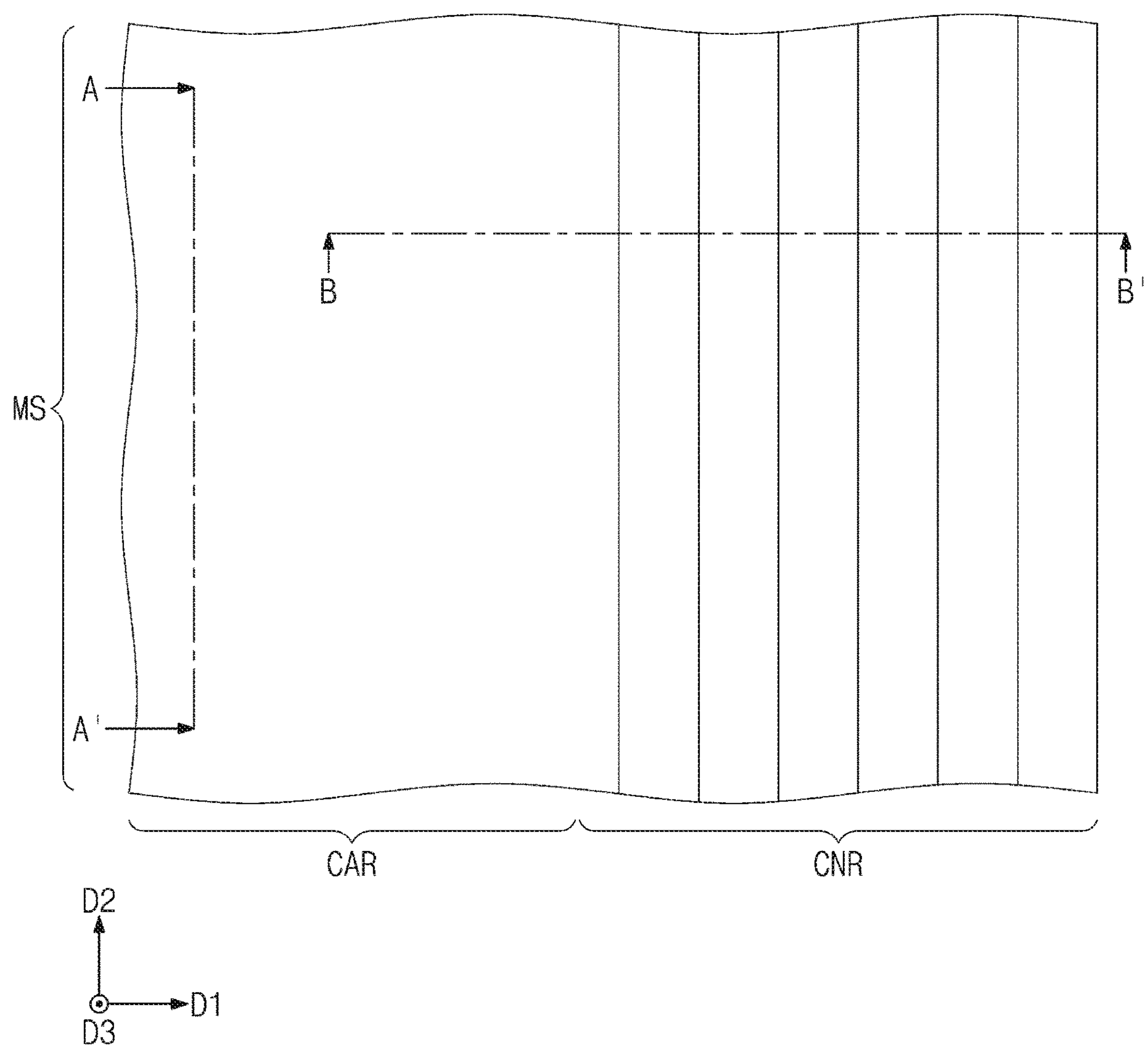
FIG. 16A illustrates a plan view showing a method of fabricating a semiconductor device according to some example embodiments of the present inventive concepts.
Figure 16B:
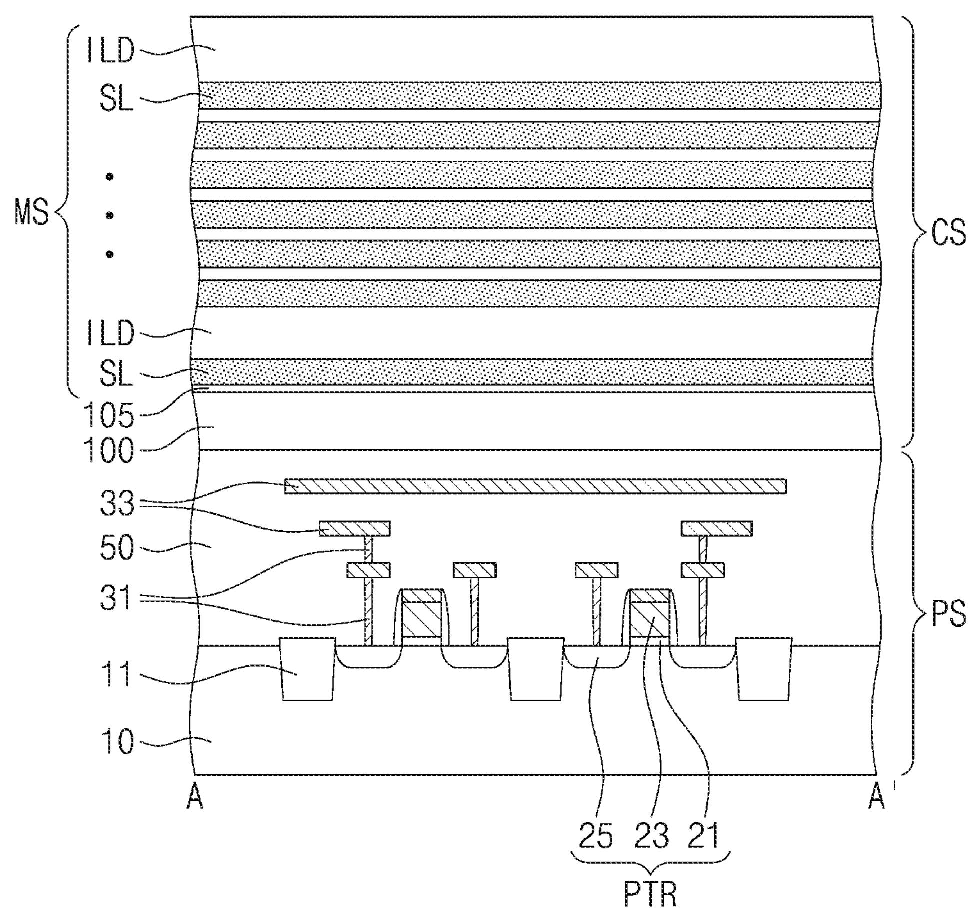
FIGS. 16B and 16C illustrate cross-sectional views respectively taken along lines A-A' and B-B' of FIG. 16A, showing a method of fabricating a semiconductor device according to some example embodiments of the present inventive concepts.
Figure 16C:
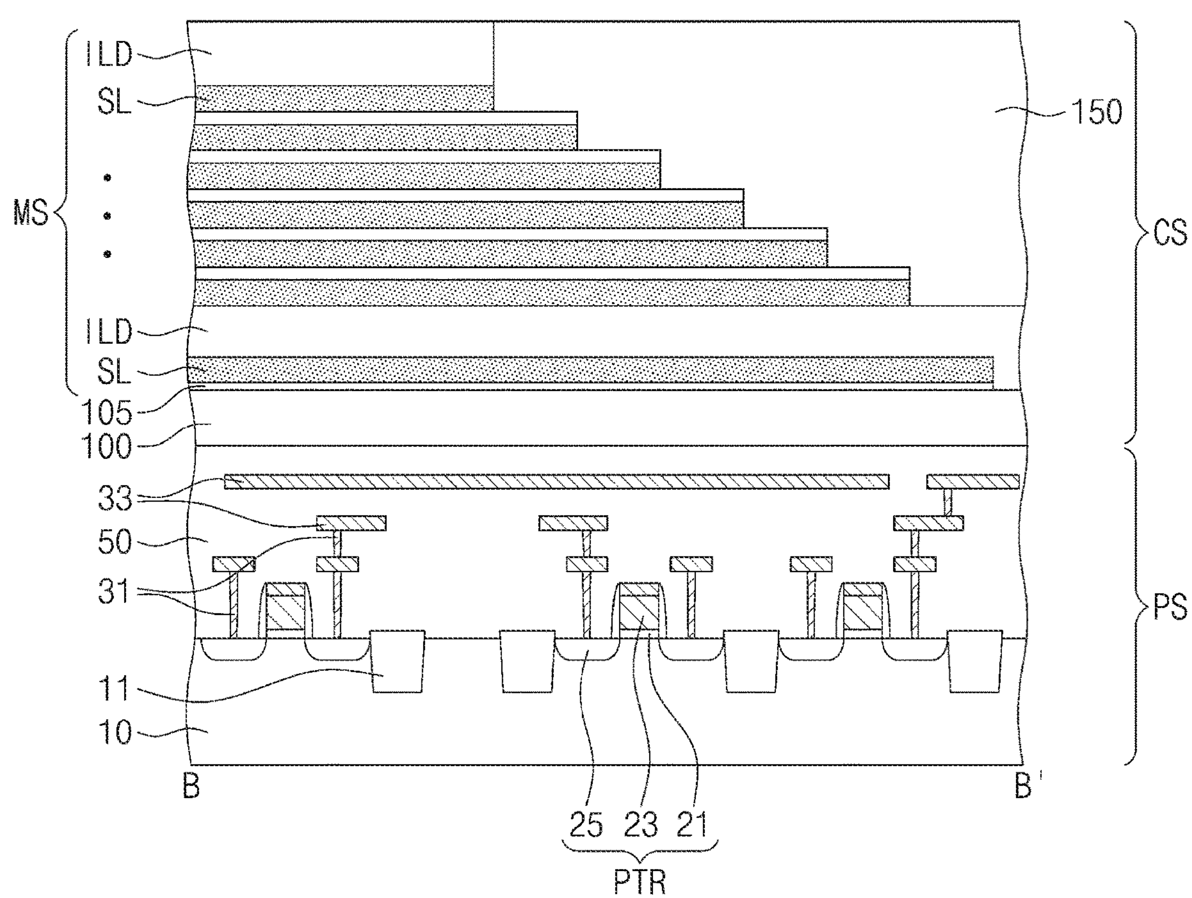

FIG. 16A illustrates a plan view showing a method of fabricating a semiconductor device according to some example embodiments of the present inventive concepts. FIGS. 16B and 16C illustrate cross-sectional views respectively taken along lines A-A' and B-B' of FIG. 16A, showing a method of fabricating a semiconductor device according to some example embodiments of the present inventive concepts.

Referring to FIGS. 16A to 16C, a logic structure PS may be formed before the mold structure MS is formed on the substrate 100. The logic structure PS may be formed beneath the substrate 100.

For example, a lower substrate 10 may be prepared. The lower substrate 10 may be, for example, a silicon substrate having the first conductivity (e.g., p-type). A device isolation layer 11 may be formed in the lower substrate 10, defining active regions.

The logic structure PS may be formed on the lower substrate 10. The formation of the logic structure PS may include forming peripheral logic circuits PTR on the lower substrate 10, forming peripheral connection structures 31 and 33 connected to the peripheral logic circuits PTR, and forming a lower dielectric layer 50. The peripheral logic circuits PTR may include metal oxide semiconductor (MOS) transistors each of which uses the lower substrate 10 as a channel. For example, the formation of the peripheral logic circuits PTR may include forming in the lower substrate 10 the device isolation layer 11 defining the active regions, sequentially forming a peripheral gate dielectric layer 21 and a peripheral gate electrode 23 on the lower substrate 10, and then forming source/drain regions 25 by implanting impurities into the lower substrate 10 on opposite sides of the peripheral gate electrode 23. A peripheral gate spacer may be formed on a sidewall of the peripheral gate electrode 23.

The peripheral logic circuits PTR may be covered with the lower dielectric layer 50 that includes a single dielectric layer or a plurality of stacked dielectric layers. The lower dielectric layer 50 may include, for example, a silicon oxide layer, a silicon nitride layer, a silicon oxynitride layer, or a low-k dielectric layer.

The substrate 100 may be formed on the lower dielectric layer 50. The substrate 100 may be a semiconductor substrate or a multi-layered substrate that includes a conductive layer. The substrate 100 may include, for example, silicon (Si), germanium (Ge), silicon germanium (SiGe), gallium arsenic (GaAs), indium gallium arsenic (InGaAs), aluminum gallium arsenic (AlGaAs), or a mixture thereof. The substrate 100 may be a semiconductor substrate doped with first conductivity impurities or an intrinsic semiconductor substrate with no doped impurities. The mold structure MS may be formed on the substrate 100.

Figure 17A:
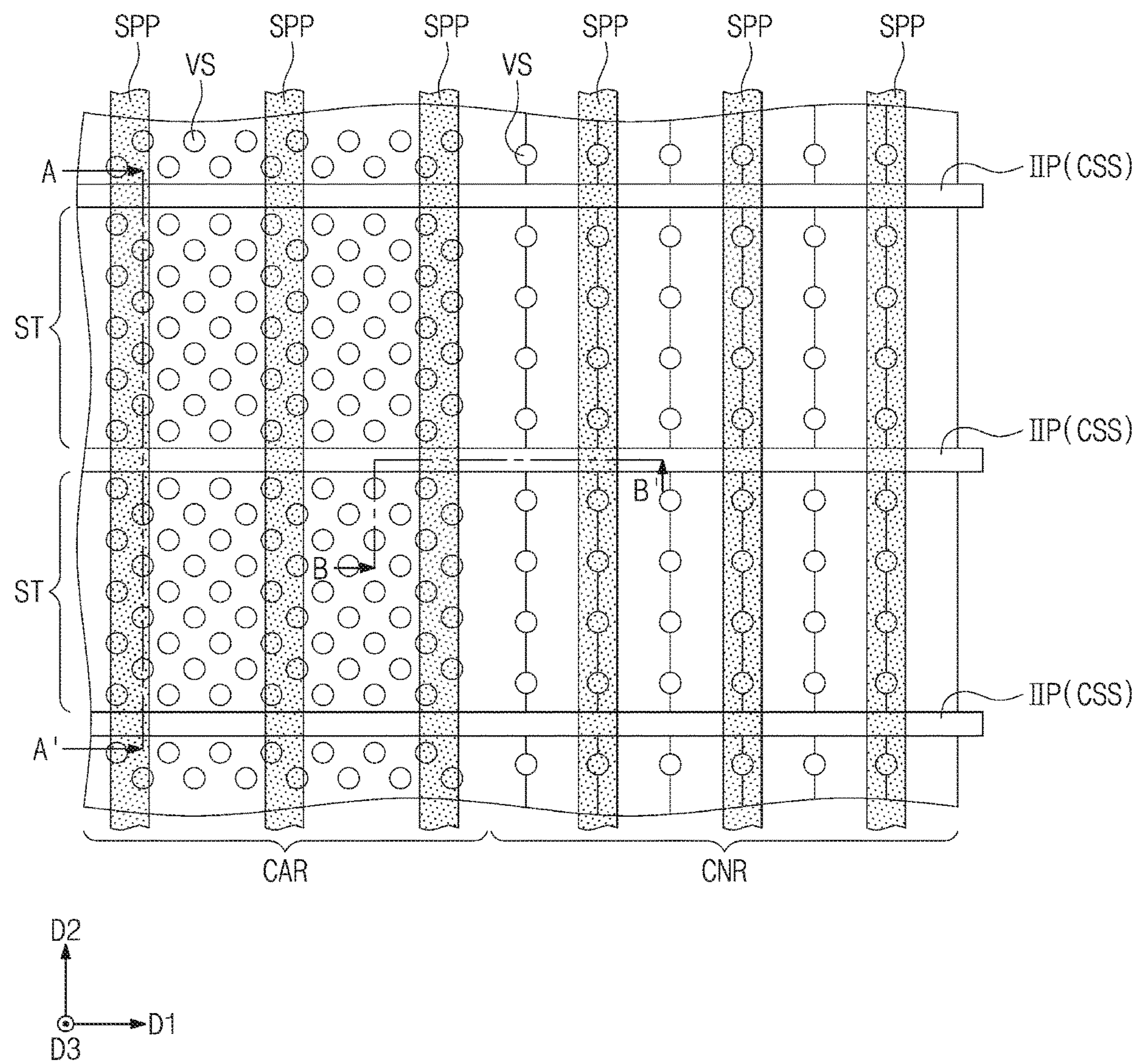
FIG. 17A illustrates a plan view showing a method of fabricating a semiconductor device according to some example embodiments of the present inventive concepts.
Figure 17B:
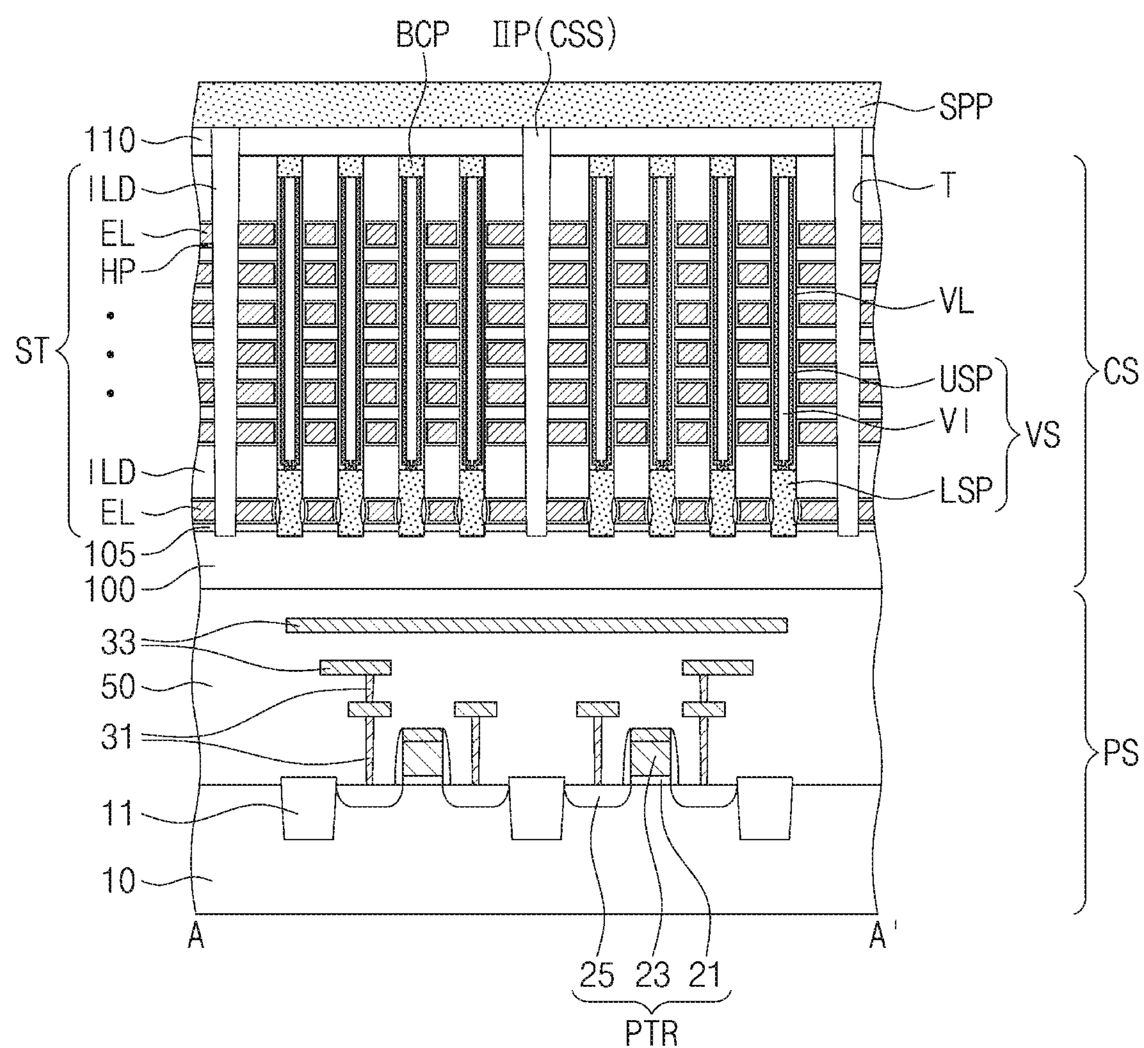
FIGS. 17B and 17C illustrate cross-sectional views respectively taken along lines A-A' and B-B' of FIG. 17A, showing a method of fabricating a semiconductor device according to some example embodiments of the present inventive concepts.
Figure 17C:
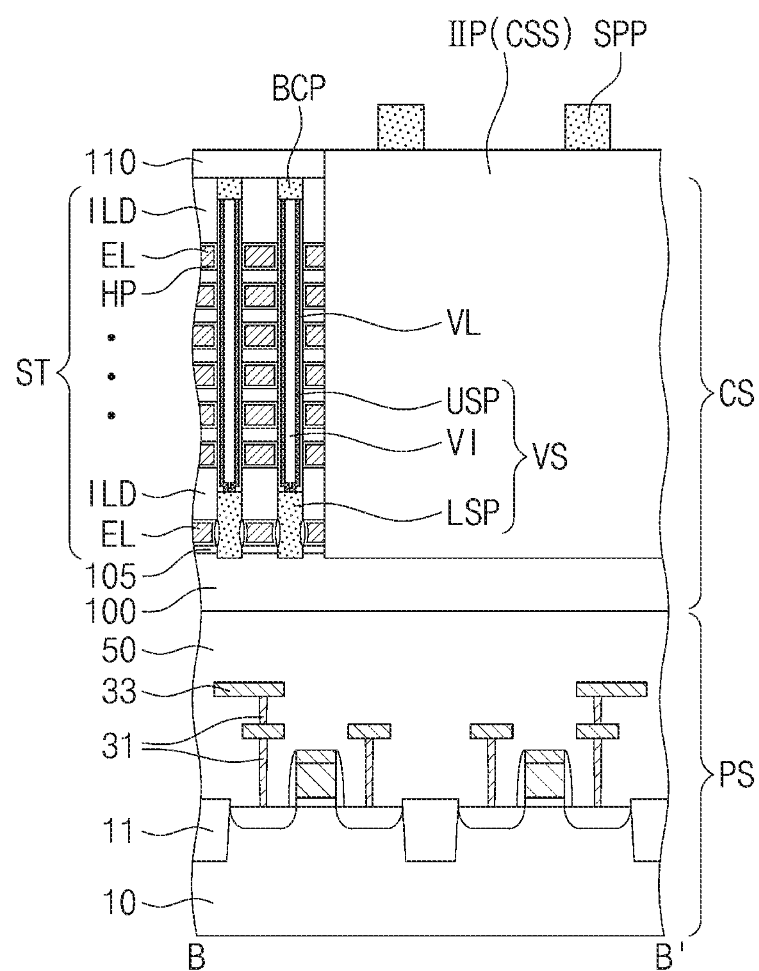

FIG. 17A illustrates a plan view showing a method of fabricating a semiconductor device according to some example embodiments of the present inventive concepts. FIGS. 17B and 17C illustrate cross-sectional views respectively taken along lines A-A' and B-B' of FIG. 17A, showing a method of fabricating a semiconductor device according to some example embodiments of the present inventive concepts.

Referring to FIGS. 17A to 17C, after the stack structures ST are formed, the separation structure CSS may be formed in the trench T. Differently from that discussed with reference to FIGS. 9A to 9C, the separation structure CSS may include a separation dielectric pattern IIP.

For example, as discussed with reference to FIGS. 7A to 7C and 8A to 8C, the sacrificial patterns SL in the preliminary stack structures PST may be replaced with the electrodes EL to form the stack structures ST. A doping process for forming the common source region CSR may be omitted. The separation dielectric pattern IIP may be formed between facing sidewalls of the stack structures ST. The separation dielectric pattern IIP may include, for example, a silicon oxide layer.

The separation dielectric pattern IIP may have a top surface at the same level as that of the top surface of the first interlayer dielectric layer 110. The top surface of the separation dielectric pattern IIP may be coplanar with the top surface of the first interlayer dielectric layer 110. The support pattern SPP may partially cover the top surface of the separation dielectric pattern IIP. A semiconductor device of the present embodiment may include the logic structure PS formed beneath the substrate 100.

According to some example embodiments of the present inventive concepts, a support pattern may connect stack structures to each other, and thus the stack structures may be reduced or prevented from leaning or collapse. Furthermore, a substrate may be reduced or prevented from asymmetric warpage resulting from anisotropic tensile stress. As a result, it may be possible to provide a semiconductor device having improved reliability.

Although some example embodiments of the present inventive concepts have been described and illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the inventive concepts.

What is claimed is:

1. A method of fabricating a semiconductor device, the method comprising:

forming on a substrate a mold structure including a plurality of sacrificial patterns and a plurality of dielectric patterns that are alternately stacked;

trimming the mold structure to form a stepwise structure;

patterning the mold structure to form a plurality of preliminary stack structures extending in a first direction;

forming on the preliminary stack structures a support pattern that extends in a direction intersecting the first direction and extends across the preliminary stack structures; and replacing the sacrificial patterns with conductive patterns to form a plurality of stack structures from the preliminary stack structures, wherein the support pattern remains on the plurality of stack structures.

2. The method of claim 1, further comprising:

before forming the support pattern, forming a gap-fill pattern between the plurality of preliminary stack structures; and after forming the support pattern, removing the gap-fill pattern to expose side surfaces of the plurality of preliminary stack structures, wherein the support pattern covers a portion of a top surface of the gap-fill pattern.

3. The method of claim 1, wherein forming the support pattern comprises forming a plurality of support patterns arranged in the first direction.

4. The method of claim 1, wherein the support pattern extends in a second direction perpendicular to the first direction, the support pattern including a material whose thermal expansion coefficient is greater than that of the substrate.

5. The method of claim 1, wherein the support pattern extends in a direction inclined to the first direction, the support pattern including a material whose thermal expansion coefficient is less than that of the substrate.

6. The method of claim 1, before patterning the mold structure, further comprising forming a vertical channel structure that penetrates the mold structure and connects with the substrate, wherein a bottom surface of the support pattern is at a higher level than that of a top surface of the vertical channel structure.

7. The method of claim 1, further comprising forming a separation structure between facing side surfaces of the plurality of stack structures.

8. The method of claim 7, after forming the separation structure, further comprising removing the support pattern.

9. The method of claim 7, wherein the separation structure includes:

a spacer that covers facing side surfaces of the plurality of stack structures; and a common source plug that penetrates the spacer and connects with the substrate.

10. The method of claim 7, wherein the separation structure includes a separation dielectric pattern that fills a space between the facing side surfaces of the plurality of stack structures.

11. The method of claim 7, after forming the separation structure, further comprising removing the support pattern.

12. The method of claim 7, wherein the support pattern covers a portion of a top surface of the separation structure and exposes other portion of the top surface of the separation structure.

13. The method of claim 1, wherein the support pattern includes:

a first segment that extends in a second direction perpendicular to the first direction; and a second segment that extends in a direction inclined to the first direction.

14. A method of fabricating a semiconductor device, the method comprising:

forming on a substrate first and second preliminary stack structures that extend in parallel along a first direction, each of the first and second preliminary stack structures including a plurality of sacrificial patterns, a plurality of dielectric patterns that are alternately stacked, a cell array region, and a stepwise structure on a connection region, the connection region adjacent to the cell array region;

forming a gap-fill pattern between facing side surfaces of the first and second preliminary stack structures;

forming a support pattern on the first and second preliminary stack structures, the support pattern covering a portion of a top surface of the gap-fill pattern; and removing the gap-fill pattern to expose the facing side surfaces of the first and second preliminary stack structures.

15. The method of claim 14, after removing the gap-fill pattern, further comprising replacing the sacrificial patterns with conductive patterns to form first and second stack structures from the first and second preliminary stack structures, respectively, wherein the support pattern remains on the first and second stack structures.

16. The method of claim 15, further comprising forming a separation structure between the first and second stack structures, wherein the support pattern covers a portion of a top surface of the separation structure.

17. The method of claim 14, wherein the support pattern extends in a direction intersecting the first direction and extends across the first and second preliminary stack structures.

18. A semiconductor device, comprising:

a plurality of stack structures that extend in parallel along a first direction on a substrate, each of the plurality of stack structures including a plurality of electrodes and a plurality of dielectric patterns that are alternately stacked on the substrate, the plurality of stack structures each including a cell array region and a stepwise structure on a connection region, the connection region adjacent to the cell array region in the first direction;

a plurality of vertical structures that penetrate the plurality of stack structures;

a separation structure between the plurality of stack structures, the separation structure being extended in the first direction; and a support pattern on the plurality of stack structures that extends in a direction across the stack structures, the direction intersecting the first direction, wherein the support pattern covers a portion of a top surface of the separation structure.

19. The semiconductor device of claim 18, wherein the support pattern extends in a second direction perpendicular to the first direction, the support pattern including a material whose thermal expansion coefficient is greater than that of the substrate.

20. The semiconductor device of claim 18, wherein the support pattern extends in a direction inclined to the first direction, the support pattern including a material whose thermal expansion coefficient is less than that of the substrate.

* * * * *